(12) United States Patent
Kubouchi

(10) Patent No.: US 11,996,452 B2
(45) Date of Patent: May 28, 2024

(54) SEMICONDUCTOR DEVICE INCLUDING AN IGBT WITH REDUCED VARIATION IN THRESHOLD VOLTAGE

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 87 days.

(21) Appl. No.: 17/148,525

(22) Filed: Jan. 13, 2021

(65) Prior Publication Data

US 2021/0226017 A1 Jul. 22, 2021

(30) Foreign Application Priority Data

Jan. 17, 2020 (JP) .................................. 2020-006025
Dec. 24, 2020 (JP) .................................. 2020-215872

(51) Int. Cl.
| | |
|---|---|
| *H01L 29/32* | (2006.01) |
| *H01L 21/22* | (2006.01) |
| *H01L 27/06* | (2006.01) |
| *H01L 29/10* | (2006.01) |
| *H01L 29/739* | (2006.01) |
| *H01L 29/861* | (2006.01) |

(52) U.S. Cl.
CPC ............ *H01L 29/32* (2013.01); *H01L 21/221* (2013.01); *H01L 27/0664* (2013.01); *H01L 29/1095* (2013.01); *H01L 29/7397* (2013.01); *H01L 29/8613* (2013.01)

(58) Field of Classification Search
CPC ..... H01L 29/32; H01L 29/36; H01L 29/1095; H01L 29/7397; H01L 29/7302; H01L 29/7802; H01L 29/7803
See application file for complete search history.

(56) References Cited

U.S. PATENT DOCUMENTS

| | | |
|---|---|---|
| 10,056,450 B2 | 8/2018 | Kouno |
| 10,090,407 B2 | 10/2018 | Tashima |
| 10,243,058 B2 | 3/2019 | Yonehara |
| 10,304,928 B2 | 5/2019 | Tamura |
| 10,381,225 B2 | 8/2019 | Mukai |
| 10,490,646 B2 | 11/2019 | Onozawa |
| 10,840,361 B2 | 11/2020 | Naito |
| 2008/0197379 A1 | 8/2008 | Aono |

(Continued)

FOREIGN PATENT DOCUMENTS

| | | |
|---|---|---|
| JP | 2002343805 A | 11/2002 |
| JP | 2008205015 A | 9/2008 |

(Continued)

*Primary Examiner* — Jesse Y Miyoshi

(57) ABSTRACT

There is provided a semiconductor device including: a semiconductor substrate that has an upper surface and a lower surface and that is provided with a drift region of a first conductivity type; a trench portion that is provided to reach the drift region from the upper surface of the semiconductor substrate; and a mesa portion that is interposed between trench portions, in which the mesa portion has a base region of a second conductivity type that is provided between the drift region and the upper surface, and a first region that has a concentration peak of a hydrogen chemical concentration at a first depth position in the mesa portion.

31 Claims, 16 Drawing Sheets

(56) References Cited

U.S. PATENT DOCUMENTS

| | | | |
|---|---|---|---|
| 2011/0101416 A1* | 5/2011 | Schulze | H01L 29/7397 438/341 |
| 2016/0087045 A1 | 3/2016 | Shimizu | |
| 2020/0161445 A1* | 5/2020 | Miyamoto | H01L 29/36 |
| 2020/0357903 A1 | 11/2020 | Kubouchi | |

FOREIGN PATENT DOCUMENTS

| | | |
|---|---|---|
| JP | 2012069861 A | 4/2012 |
| JP | 2015185742 A | 10/2015 |
| JP | 2016063111 A | 4/2016 |
| JP | 2017168512 A | 9/2017 |
| JP | 2018152410 A | 9/2018 |
| WO | 2016051970 A1 | 4/2016 |
| WO | 2016204227 A1 | 12/2016 |
| WO | 2017047285 A1 | 3/2017 |
| WO | 2018030444 A1 | 2/2018 |
| WO | 2020036015 A1 | 2/2020 |

* cited by examiner g-g

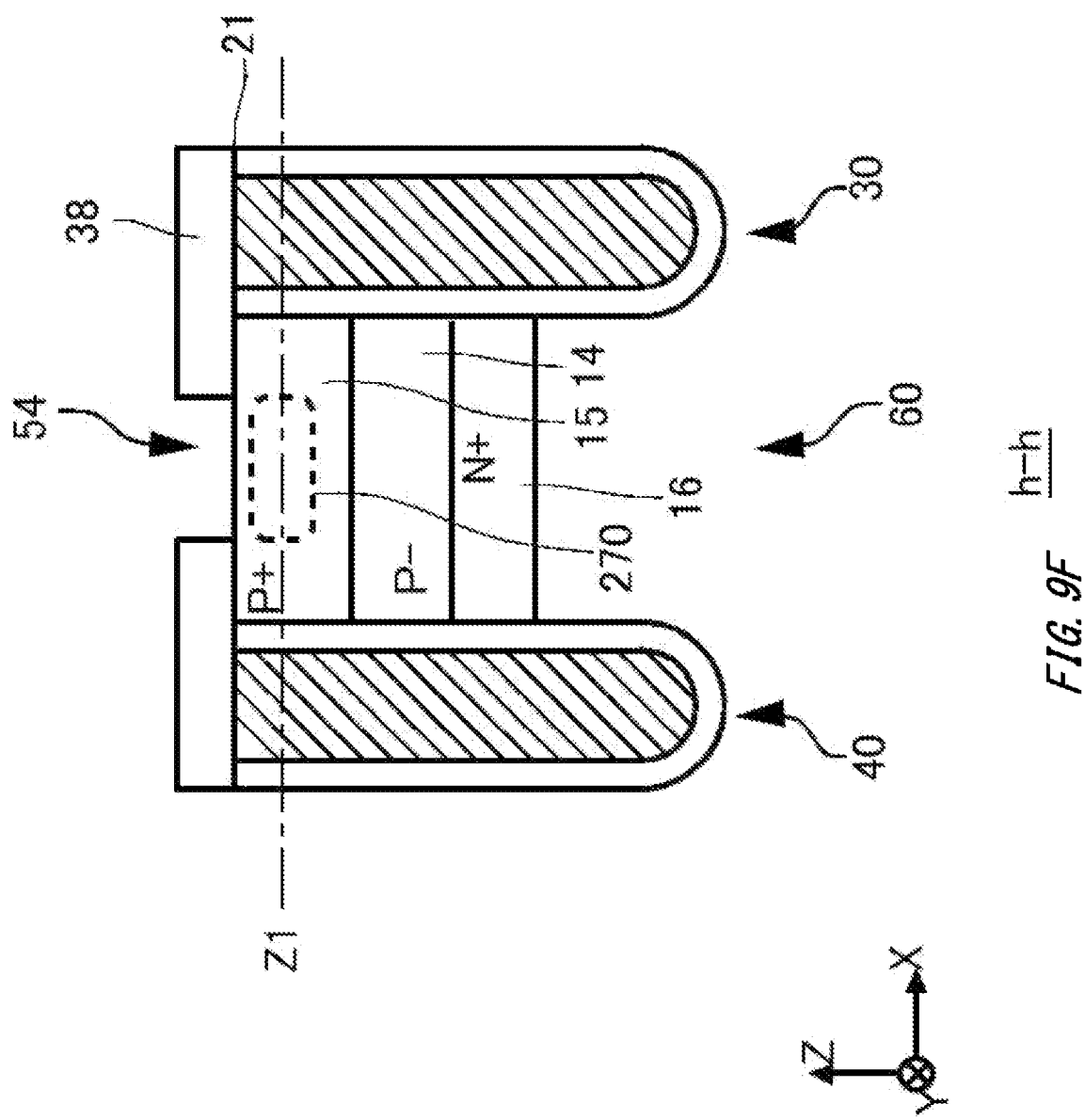
FIG. 9F  h-h

SEMICONDUCTOR DEVICE INCLUDING AN IGBT WITH REDUCED VARIATION IN THRESHOLD VOLTAGE

BACKGROUND

1. Technical Field

The present invention relates to a semiconductor device.

2. Related Art

In the related art, a technique, in which hydrogen is implanted at a predetermined depth of a semiconductor substrate to be diffused such that the hydrogen is combined with a lattice defect formed in a region through which the hydrogen has passed to serve as a donor, and thus a doping concentration can be made to be high, has been known (refer to, for example, Patent Document 1).

Patent Document 1: Re-Publication of PCT International Publication No. 2016-204227

Technical Problem

In a semiconductor device, preferably, a variation in a threshold voltage of a switching element such as a transistor is small.

SUMMARY

In order to solve the above described problem, an aspect of the present invention provides a semiconductor device including a semiconductor substrate that has an upper surface and a lower surface and that is provided with a drift region of a first conductivity type. The semiconductor device may include a trench portion that is provided to reach the drift region from the upper surface of the semiconductor substrate. The semiconductor device may include a mesa portion that is interposed between the trench portions. The mesa portion may have a base region of a second conductivity type that is provided between the drift region and the upper surface. The mesa portion may have a first region that has a concentration peak of a hydrogen chemical concentration at a first depth position in the mesa portion.

The first depth position may be above a lower end of the base region. A hydrogen chemical concentration at the first depth position, which is at a center of a width direction of the mesa portion, may be higher than a hydrogen chemical concentration at the first depth position in a region in contact with the trench portion.

The semiconductor device may include a second region that is provided in the mesa portion different from the mesa portion in which the first region is provided and that has a lower hydrogen chemical concentration at the first depth position than a hydrogen chemical concentration at the first depth position in the first region.

The mesa portion may have a high concentration region that is arranged between the drift region and the upper surface of the semiconductor substrate and that has a higher doping concentration than a doping concentration of the base region. The first depth position may be arranged at a position shallower than a lower end of the high concentration region.

The base region may have a peak of the doping concentration, at a second depth position which is deeper than the first depth position, at an interface in contact with a side wall of the trench portion.

The high concentration region may be an emitter region of the first conductivity type that is provided in contact with the trench portion and that has a higher doping concentration than a doping concentration of the drift region.

The high concentration region may be a contact region of the second conductivity type that has a higher doping concentration than the doping concentration of the base region.

The semiconductor device may include an emitter electrode that is arranged above the upper surface of the semiconductor substrate. In a depth direction, a distance between the first depth position, and the upper surface of the semiconductor substrate in contact with the emitter electrode may be 1 μm or less.

The semiconductor device may include an interlayer dielectric film that covers the upper surface of the semiconductor substrate. The interlayer dielectric film may have a contact hole that exposes the upper surface of the semiconductor substrate. The first region may be provided at a position overlapping the contact hole in a top plan view.

The mesa portion may have an emitter region of the first conductivity type that is arranged between the drift region and the upper surface of the semiconductor substrate and that has a higher doping concentration than a doping concentration of the base region. The semiconductor device may include an interlayer dielectric film that covers the upper surface of the semiconductor substrate. The interlayer dielectric film may have a contact hole that exposes the upper surface of the semiconductor substrate. The first region may be provided at a position overlapping the contact hole in a top plan view. The semiconductor device may include a trench contact that is provided on a lower surface side of the contact hole and that passes through the emitter region from the upper surface. The first region may be provided at a position deeper than a bottom surface of the trench contact.

The base region may have a peak of the doping concentration, at a second depth position which is shallower than the first depth position, at an interface in contact with a side wall of the trench portion.

The bottom surface of the trench contact may be arranged at a third depth position from the upper surface toward the lower surface in a depth direction. The second depth position may be shallower than the third depth position. The third depth position may be shallower than the first depth position.

The semiconductor device may include a transistor portion that has a collector region of the second conductivity type between the drift region and the lower surface of the semiconductor substrate. The semiconductor device may include a diode portion that has a cathode region of the first conductivity type between the drift region and the lower surface of the semiconductor substrate. The first region may be provided in the mesa portion of the transistor portion. The second region may be provided in the mesa portion of the diode portion.

The transistor portion may have a region of the first conductivity type and a region of the second conductivity type that are alternately arranged along a longitudinal direction of the trench portion on an upper surface of the mesa portion. The first region may be arranged to overlap the region of the first conductivity type and not to overlap the region of the second conductivity type in a top plan view.

The semiconductor device may include a first lower region that is arranged below the first region on an upper surface side of the semiconductor substrate. The semiconductor device may include a second lower region that is provided at the same depth position as the first lower region and that is arranged below the second region. A concentration of a recombination center in the first lower region may be lower than a concentration of a recombination center in the second lower region.

The semiconductor device may include a region of the second conductivity type that is provided to be away from the trench portion on an upper surface of the mesa portion. The semiconductor device may include a region of the first conductivity type that is provided between the trench portion and the region of the second conductivity type and that is in contact with the trench portion on the upper surface of the mesa portion. The first region may be arranged to overlap the region of the second conductivity type in a top plan view. The first region may be provided in the mesa portion of the transistor portion.

The summary clause does not necessarily describe all necessary features of the embodiments of the present invention. The present invention may also be a sub-combination of the features described above.

BRIEF DESCRIPTION OF THE DRAWINGS

FIG. 9F is a figure showing an example of a cross section h-h in FIG. 9B.

DESCRIPTION OF EXEMPLARY EMBODIMENTS

Figure 1:
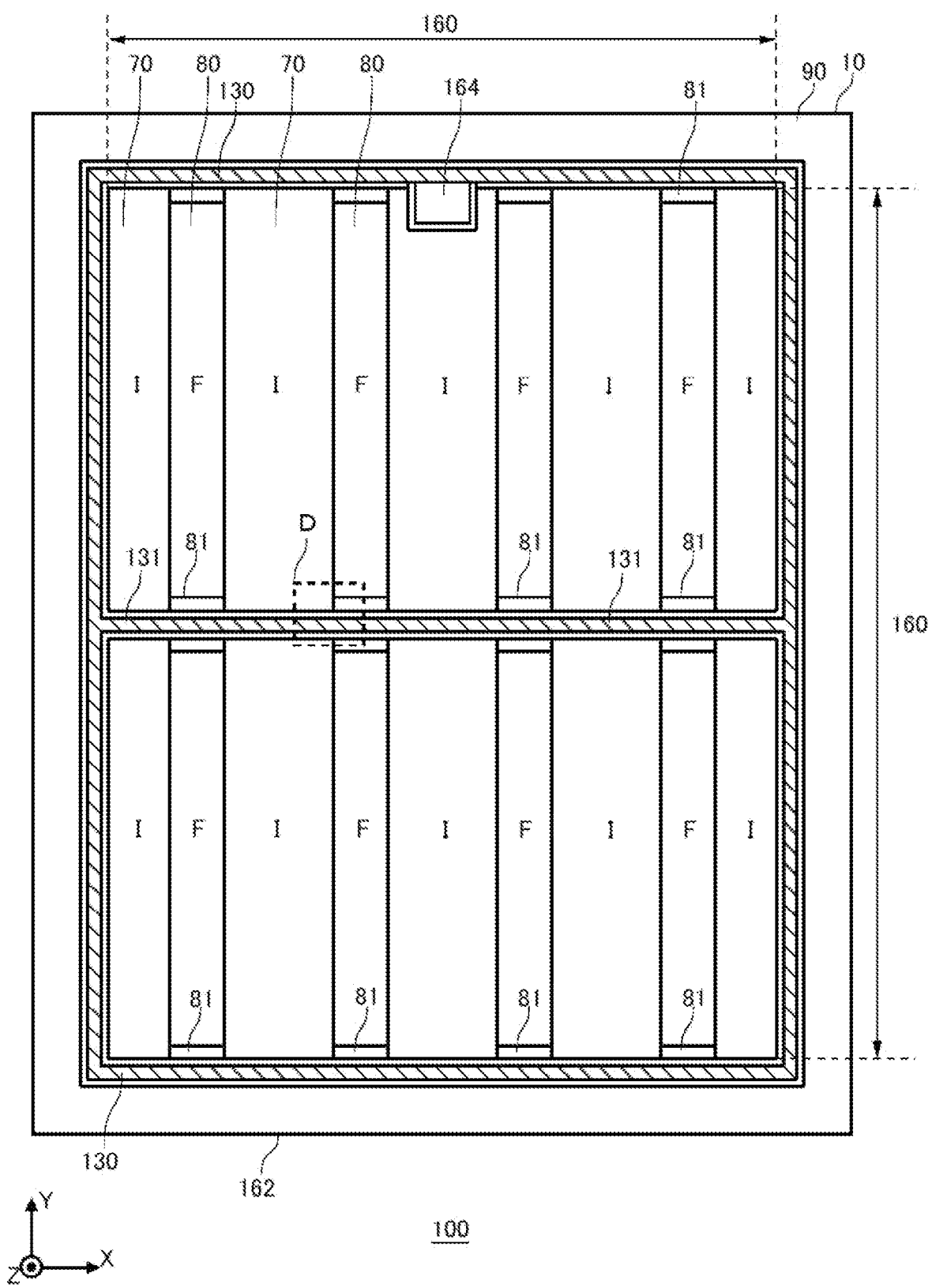
FIG. 1 is a top plan view showing an example of a semiconductor device 100.

Hereinafter, the present invention will be described through embodiments of the invention, but the following embodiments do not limit the invention according to the claims. Further, not all the combinations of features described in the embodiments are essential for means to solve the problem in the invention.

In the present specification, one side in a direction parallel to a depth direction of a semiconductor substrate is referred to as an "upper" side, and the other side is referred to as a "lower" side. One surface of two principal surfaces of a substrate, a layer or another member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components and do not limit a specific direction. For example, a direction that the Z axis shows is not limited to a height direction with respect to the ground. Note that a +Z axis direction and a −Z axis direction are directions opposite to each other. In a case where a Z axis direction is described without a description of positive and negative signs, the direction means a direction parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

Further, the region from the center of the semiconductor substrate in the depth direction to the upper surface of the semiconductor substrate may be referred to as an upper surface side. Similarly, the region from the center of the semiconductor substrate in the depth direction to the lower surface of the semiconductor substrate may be referred to as a lower surface side. In the present specification, a center position of the semiconductor substrate in the depth direction may be referred to as Zc.

In the present specification, a phrase such as "same" or "equal" may include the case which has an error due to a variation in manufacturing or the like. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity of the N type, or a semiconductor presenting conductivity of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is ND and the acceptor concentration is NA, the net doping concentration at any position is given as ND-NA. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type. In the present specification, a unit system is the SI base unit system unless otherwise noted. Although a unit of a length may be represented by centimeters, various calculations may be performed after conversion to meters (n).

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the region of the N type may be referred to as the donor concentration, and the doping concentration of the region of the P type may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is approximately uniform in a region, or the like, an average value of the concentration of the donor, acceptor or net doping in the region may be set as the concentration of the donor, acceptor or net doping. In the present specification, atoms/cm$^3$ or /cm$^3$ is used to indicate a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is about 99% of chemical concentrations of these. On the other hand, in the silicon semiconductor, a donor concentration of hydrogen serving as a donor is about 0.1% to 10% of a chemical concentration of hydrogen. Each concentration in the present specification may be a value at room temperature. As the value at the room temperature, for example, a value at 300 K (kelvins) (about 26.9° C.) may be used.

FIG. 1 is a top plan view showing an example of a semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate formed of a semiconductor material. As an example, the semiconductor substrate 10 is a silicon substrate, but a material of the semiconductor substrate 10 is not limited to silicon.

The semiconductor substrate 10 has an edge side 162 in the top plan view. When the top plan view is merely mentioned in the present specification, it means that an upper surface side of the semiconductor substrate 10 is viewed from above. The semiconductor substrate 10 of the present example has two sets of edge sides 162 opposite to each other in the top plan view. In FIG. 1, the X axis and the Y axis are parallel to any of the edge sides 162. Further, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but an illustration thereof is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are alternately arranged along a predetermined array direction (the X axis direction in the present example) on the upper surface of the semiconductor substrate 10. The active portion 160 in another example may be provided with only one of the transistor portion 70 and the diode portion 80.

In FIG. 1, a region where the transistor portion 70 is arranged is denoted by a symbol "I", and a region where the diode portion 80 is arranged is denoted by a symbol "F". In the present specification, a direction perpendicular to an array direction in the top plan view may be referred to as an extension direction (the Y axis direction in FIG. 1). Each of the transistor portion 70 and the diode portion 80 may have a longitudinal length in the extension direction. That is, for the transistor portion 70, a length in the Y axis direction is greater than a width in the X axis direction. Similarly, for the diode portion 80, a length in the Y axis direction is greater than a width in the X axis direction. The extension directions of the transistor portion 70 and the diode portion 80 may respectively be the same as a longitudinal direction of each trench portion described below.

The diode portion 80 has a cathode region of the N+ type in a region in contact with the lower surface of the semiconductor substrate 10. In the present specification, the region where the cathode region is provided is referred to as the diode portion 80. That is, the diode portion 80 is a region which overlaps the cathode region in the top plan view. On the lower surface of the semiconductor substrate 10, a collector region of the P+ type may be provided in a region other than the cathode region. In the present specification, the diode portion 80 may also include an extension region 81 where the diode portion 80 extends, in the Y axis direction, up to a gate runner described below. On a lower surface of the extension region 81, the collector region is provided.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of the present example has a gate pad 164. The semiconductor device 100 may have a pad such as an anode pad, a cathode pad, and a current detection pad. Each pad is arranged in a region in a vicinity of the edge side 162. The vicinity of the edge side 162 indicates a region between the edge side 162 and the emitter electrode in the top plan view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner which connects the gate pad 164 and the gate trench portion. In FIG. 1, the gate runner is hatched with diagonal lines.

The gate runner of the present example has an outer peripheral gate runner 130 and an active side gate runner 131. The outer peripheral gate runner 130 is arranged between the active portion 160 and the edge side 162 of the semiconductor substrate 10 in the top plan view. The outer peripheral gate runner 130 of the present example surrounds the active portion 160 in the top plan view. A region surrounded by the outer peripheral gate runner 130 in the top plan view may be set as the active portion 160. Further, the outer peripheral gate runner 130 is connected to the gate pad 164. The outer peripheral gate runner 130 is arranged above the semiconductor substrate 10. The outer peripheral gate runner 130 may be a metal wiring including aluminum or the like.

The active side gate runner 131 is provided in the active portion 160. By providing the active side gate runner 131 in the active portion 160, it is possible to reduce a variation in wiring length from the gate pad 164 with respect to each region of the semiconductor substrate 10.

The active side gate runner 131 is connected to the gate trench portion of the active portion 160. The active side gate runner 131 is arranged above the semiconductor substrate 10. The active side gate runner 131 may be a wiring formed of a semiconductor such as polysilicon doped with an impurity.

The active side gate runner 131 may be connected to the outer peripheral gate runner 130. The active side gate runner 131 of the present example is provided to extend in the X axis direction so as to cross the active portion 160 from one outer peripheral gate runner 130 to the other outer peripheral gate runner 130 at substantially the center in the Y axis direction. When the active portion 160 is divided by the active side gate runner 131, the transistor portion 70 and the diode portion 80 may be alternately arranged in the X axis direction in each divided region.

Further, the semiconductor device 100 may include a temperature sensing portion (not shown) which is a PN junction diode formed of polysilicon or the like, and a current detection portion (not shown) which simulates an operation of the transistor portion provided in the active portion 160.

The semiconductor device 100 of the present example includes an edge termination structure portion 90 between the active portion 160 and the edge side 162 in the top plan view. The edge termination structure portion 90 of the present example is arranged between the outer peripheral gate runner 130 and the edge side 162. The edge termination structure portion 90 relaxes an electric field concentration on the upper surface side of the semiconductor substrate 10. The edge termination structure portion 90 may include at least one of a guard ring, a field plate, and a RESURF which are annularly provided to surround the active portion 160.

Figure 2:
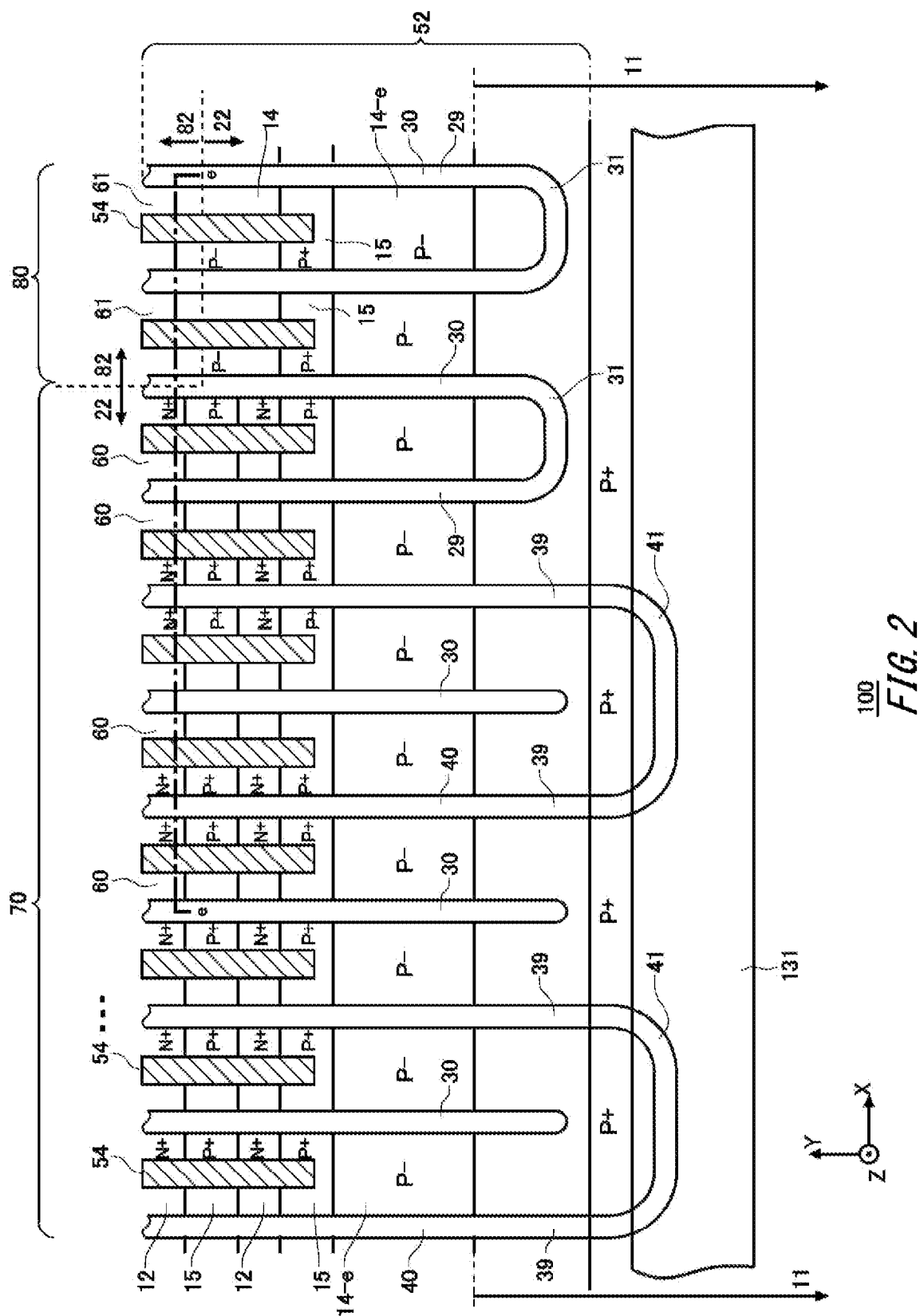
FIG. 2 is an enlarged view of a region D in FIG. 1.

FIG. 2 is an enlarged view of a region D in FIG. 1. The region D is a region including the transistor portion 70, the diode portion 80, and the active side gate runner 131. The semiconductor device 100 of the present example includes a gate trench portion 40, a dummy trench portion 30, a well region 11, an emitter region 12, a base region 14, and a contact region 15 that are provided inside the upper surface side of the semiconductor substrate 10. Each of the gate trench portion 40 and the dummy trench portion 30 is an example of a trench portion. Further, the semiconductor device 100 of the present example includes an emitter electrode 52 and the active side gate runner 131 which are provided above the upper surface of the semiconductor substrate 10. The emitter electrode 52 and the active side gate runner 131 are provided in isolation from each other.

Between the emitter electrode 52 and the active side gate runner 131, and the upper surface of the semiconductor substrate 10, an interlayer dielectric film is provided, but an illustration thereof is omitted in FIG. 2. In the interlayer dielectric film of the present example, a contact hole 54 is provided to pass through the interlayer dielectric film. In FIG. 2, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active side gate runner 131 is connected to the gate trench portion 40 through the contact hole provided in the interlayer dielectric film. The active side gate runner 131 may be connected to a gate conductive portion of the gate trench portion 40 at an edge portion 41 of the gate trench portion 40 in the Y axis direction. The active side gate runner 131 is not connected to the dummy conductive portion in the dummy trench portion 30.

The emitter electrode 52 is formed of a material including metal. FIG. 2 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided to overlap the active side gate runner 131. The well region 11 is provided to extend with a predetermined width also in a range not overlapping the active side gate runner 131. The well region 11 of the present example is provided to be away from an end of the contact hole 54 in the Y axis direction toward an active side gate runner 131 side. The well region 11 is a region of a second conductivity type that has a higher doping concentration than that of the base region 14. The base region 14 of the present example is of the P− type, and the well region 11 is of the P+ type.

Each of the transistor portion 70 and the diode portion 80 has a plurality of trench portions which are arrayed in an array direction. In the transistor portion 70 of the present example, one or more gate trench portions 40 and one or more dummy trench portions 30 are alternately provided along the array direction. The diode portion 80 of the present example is provided with the plurality of dummy trench portions 30 along the array direction. The diode portion 80 of the present example is not provided with the gate trench portion 40.

The gate trench portion 40 of the present example may have two linear portions 39 extending along the extension direction perpendicular to the array direction (portions of a trench that are linear along the extension direction), and the edge portion 41 connecting the two linear portions 39. The extension direction in FIG. 2 is the Y axis direction.

Preferably, at least a part of the edge portion 41 is provided in a curved shape in the top plan view. By the edge portion 41 connecting between end portions of the two linear portions 39 in the Y axis direction, it is possible to relax the electric field concentration at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extension direction, and may have linear portions 29 and an edge portion 31 similarly to the gate trench portion 40. The semiconductor device 100 shown in FIG. 2 includes both of the linear dummy trench portion 30 having no edge portion 31, and the dummy trench portion 30 having the edge portion 31. A direction in which the linear portion 39 of the gate trench portion 40 or the linear portion 29 of the dummy trench portion 30 extend to be long in the extension direction is referred to as a longitudinal direction of the trench portion. The longitudinal direction of the gate trench portion 40 or the dummy trench portion 30 may match the extension direction. In the present example, the extension direction and the longitudinal direction are the Y axis directions. The array direction in which the plurality of gate trench portions 40 or the dummy trench portions 30 are arrayed is referred to as a short direction of the trench portion. The short direction may match the array direction. The short direction may also be perpendicular to the longitudinal direction. In the present example, the short direction is perpendicular to the longitudinal direction. In the present example, the array direction and the short direction are the X axis directions.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top plan view. That is, at the end portion of each trench portion in the Y axis direction, a bottom portion of each trench portion in the depth direction is covered with the well region 11. This makes it possible to relax the electric field concentration at the bottom portion of each trench portion.

Between the respective trench portions in the array direction, a mesa portion is provided. The mesa portion indicates a region interposed between the trench portions inside the semiconductor substrate 10. As an example, an upper end of the mesa portion is the upper surface of the semiconductor substrate 10. A depth position of a lower end of the mesa portion is the same as a depth position of a lower end of a trench portion. The mesa portion of the present example is provided to extend in the extension direction (the Y axis direction) along the trench, on the upper surface of the semiconductor substrate 10. In the present example, the transistor portion 70 is provided with a mesa portion 60, and the diode portion 80 is provided with a mesa portion 61. When the mesa portion is merely mentioned in the present specification, it indicates each of the mesa portion 60 and the mesa portion 61.

Each mesa portion is provided with the base region 14. In the mesa portion, a region arranged to be closest to the active side gate runner 131, in the base region 14 exposed on the upper surface of the semiconductor substrate 10, is set as a base region 14-e. While FIG. 2 shows the base region 14-e arranged at one end portion of each mesa portion in the extension direction, the base region 14-e is also arranged at the other end portion of each mesa portion. Each mesa portion may be provided with at least one of the emitter region 12 of a first conductivity type, and the contact region 15 of the second conductivity type in a region interposed between the base regions 14-e in the top plan view. In the present example, the emitter region 12 is of the N+ type, and the contact region 15 is of the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion up to the other trench portion in the X axis direction. As an example, the contact region 15 and the emitter region 12 in the mesa portion 60 are alternately arranged along the extension direction of the trench portion (the Y axis direction).

In another example, the contact region 15 and the emitter region 12 in the mesa portion 60 may be provided in a stripe shape along the extension direction of the trench portion (the Y axis direction). For example, the emitter region 12 is provided in a region in contact with the trench portion, and the contact region 15 is provided in a region interposed between the emitter regions 12.

The mesa portion 61 of the diode portion 80 is not provided with the emitter region 12. On an upper surface of the mesa portion 61, the base region 14 and the contact region 15 may be provided. In the region interposed between the base regions 14-e on the upper surface of the mesa portion 61, the contact region 15 may be provided in contact with each base region 14-e. On the upper surface of the mesa portion 61, the base region 14 may be provided in a region interposed between the contact regions 15. The base region 14 may be arranged in an entire region interposed between the contact regions 15.

Above each mesa portion, the contact hole 54 is provided. The contact hole 54 is arranged in the region interposed between the base regions 14-e. The contact hole 54 of the present example is provided above each region of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region 22 of the P+ type may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged to be away from the well region 11 in the Y axis direction. In this way, it is possible to improve a withstand voltage by securing a distance between the cathode region 82 and a region (the well region 11) of the P type that has a comparatively high doping concentration and that is formed up to a deep position. In the present example, an end portion of the cathode region 82 in the Y axis direction is arranged to be away from the well region 11 further than an end portion of the contact hole 54 in the Y axis direction. In another example, the end portion of the cathode region 82 in the Y axis direction may be arranged between the well region 11 and the contact hole 54.

Figure 3:
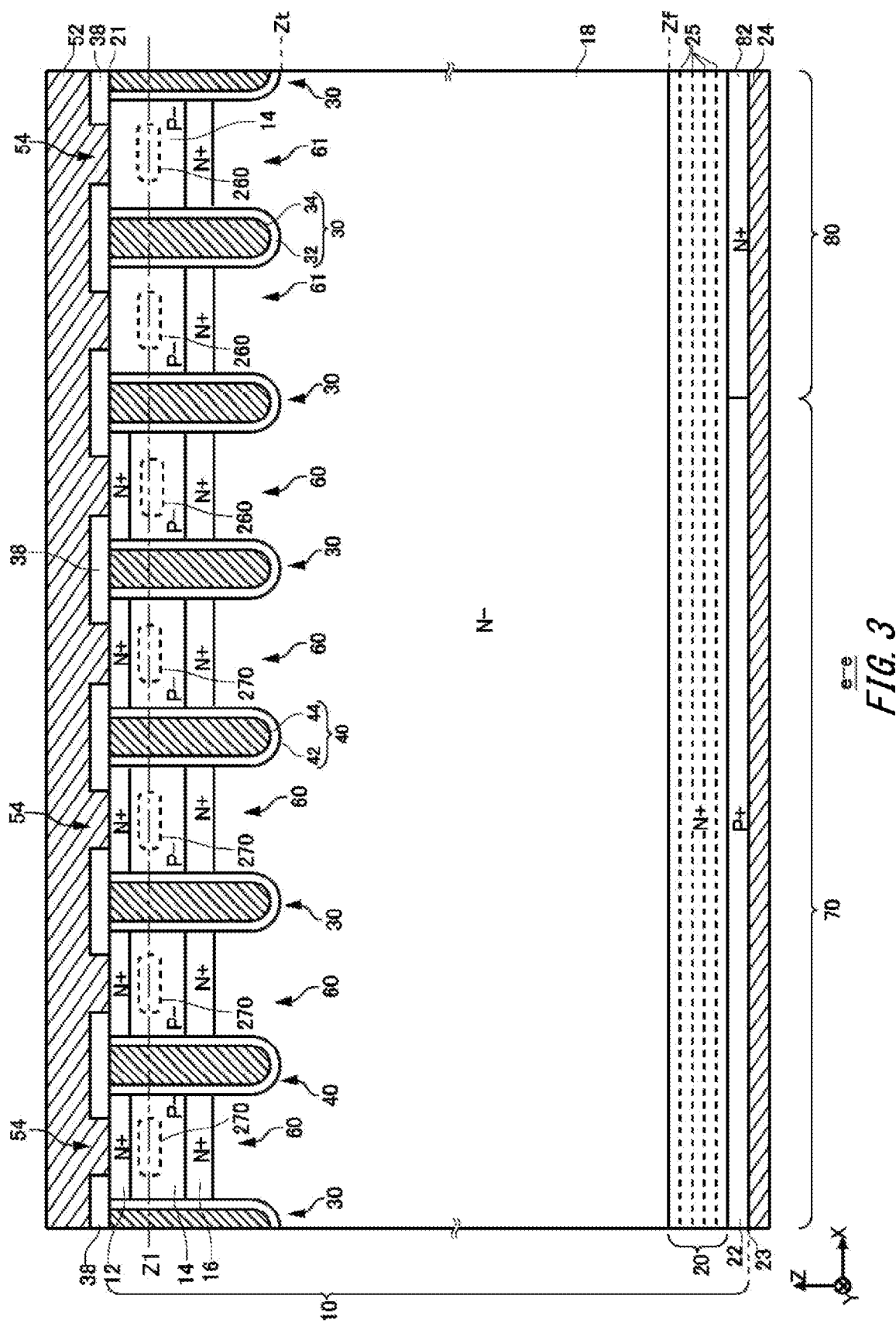
FIG. 3 is a figure showing an example of a cross section e-e in FIG. 2.

FIG. 3 is a figure showing an example of a cross section e-e in FIG. 2. The cross section e-e is an XZ plane passing through the emitter region 12 and the cathode region 82. The semiconductor device 100 of the present example has the semiconductor substrate 10, an interlayer dielectric film 38, the emitter electrode 52, and a collector electrode 24, in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, and the other dielectric film. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction connecting the emitter electrode 52 and the collector electrode 24 (the Z axis direction) is referred to as the depth direction.

The semiconductor substrate 10 has a drift region 18 of the N type or the N− type. The drift region 18 is provided in each of the transistor portion 70 and the diode portion 80.

The mesa portion 60 in the transistor portion 70 is provided with the emitter region 12 of the N+ type and the base region 14 of the P− type in order from an upper surface 21 side of the semiconductor substrate 10. Below the base region 14, the drift region 18 is provided. The mesa portion 60 may be provided with an accumulation region 16 of the N+ type. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than that of the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is a region of the N+ type that has a higher doping concentration than that of the drift region 18. The accumulation region 16 may have a concentration peak of a donor such as a phosphorus or hydrogen donor. By providing the accumulation region 16 having the high concentration between the drift region 18 and the base region 14, it is possible to enhance a carrier injection enhancement effect (IE effect) and to reduce an ON voltage. The accumulation region 16 may be provided to entirely cover a lower surface of the base region 14 in each mesa portion 60.

The mesa portion 61 of the diode portion 80 is provided with the base region 14 of the P− type in contact with the upper surface 21 of the semiconductor substrate 10. Below the base region 14, the drift region 18 is provided. Below the base region 14 in the mesa portion 61, the accumulation region 16 may be provided.

Below the drift region 18 in each of the transistor portion 70 and the diode portion 80, the buffer region 20 of the N+ type may be provided. The buffer region 20 has a higher doping concentration than the doping concentration of the drift region 18. The buffer region 20 has a concentration peak 25 having a higher doping concentration than the doping concentration of the drift region 18. The doping concentration of the concentration peak 25 indicates a doping concentration at the apex of the concentration peak 25. Further, as the doping concentration of the drift region 18, an average value of doping concentrations in the region where the doping concentration distribution is approximately flat may be used.

The buffer region 20 of the present example has three or more concentration peaks 25 in the depth direction (the Z axis direction) of the semiconductor substrate 10. The concentration peak 25 of the buffer region 20 may be provided at the same depth position as, for example, a concentration peak of hydrogen (a proton) or phosphorus. The buffer region 20 may function as a field stop layer which prevents a depletion layer extending from a lower end of the base region 14 from reaching the collector region 22 of the P+ type and the cathode region 82 of the N+ type. In the present specification, a depth position of an upper end of the buffer region 20 is set as Zf. The depth position Zf may be a position at which the doping concentration is higher than the doping concentration of the drift region 18.

Below the buffer region 20 in the transistor portion 70, the collector region 22 of the P+ type is provided. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

On the upper surface 21 side of the semiconductor substrate 10, the one or more gate trench portions 40 and the one or more dummy trench portions 30 are provided. Each trench portion passes through the base region 14 to reach the drift region 18 from the upper surface 21 of the semiconductor substrate 10. In a region where at least any of the emitter region 12, the contact region 15, and the accumulation region 16 is provided, each trench portion also passes through the doping regions of these to reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

As described above, the transistor portion 70 is provided with the gate trench portion 40 and the dummy trench portion 30. The diode portion 80 is provided with the dummy trench portion 30, and is not provided with the gate trench portion 40. In the present example, a boundary between the diode portion 80 and the transistor portion 70 in the X axis direction is the boundary between the cathode region 82 and the collector region 22.

The gate trench portion 40 has a gate trench, a gate dielectric film 42, and a gate conductive portion 44 which are provided on the upper surface 21 of the semiconductor substrate 10. The gate dielectric film 42 is provided to cover an inner wall of the gate trench. The gate dielectric film 42 may be formed by oxidizing or nitriding a semiconductor on the inner wall of the gate trench. The gate conductive portion 44 is provided on an inner side further than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in the cross section is covered with the interlayer dielectric film 38 on the upper surface 21 of the semiconductor substrate 10. The gate conductive portion 44 is electrically connected to a gate runner. When a predetermined gate voltage is applied to the gate conductive portion 44, a channel is formed by an inversion layer with electrons on a surface layer in the base region 14 at an interface in contact with the gate trench portion 40.

The dummy trench portion 30 may have the same structure as the gate trench portion 40 in the cross section. The dummy trench portion 30 has a dummy trench, a dummy dielectric film 32, and a dummy conductive portion 34 which are provided on the upper surface 21 of the semiconductor substrate 10. The dummy conductive portion 34 is electrically connected to the emitter electrode 52. The dummy dielectric film 32 is provided to cover an inner wall of the dummy trench. The dummy conductive portion 34 is provided inside the dummy trench, and is provided on an inner side further than the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. Note that bottom portions of the dummy trench portion 30 and the gate trench portion 40 may have curved surface shapes which are convex downward (curved line shapes in cross sections). In the present specification, a depth position of a lower end of the gate trench portion 40 is set as Zt.

At least some mesa portion (in the present example, some mesa portion 60) is provided with a first region 270. The first region 270 is a region where a hydrogen chemical concentration distribution in the depth direction shows a concentration peak. That is, the first region 270 is a region having a higher hydrogen chemical concentration than those of other regions in the mesa portion 60. In FIG. 3, a depth position at which the concentration peak is arranged is set as a first depth position Z1. The first depth position Z1 is arranged above the lower end position Zt of the gate trench portion 40. The first depth position Z1 may be arranged above the lower end of the base region 14.

The first region 270 can be formed, for example, by selectively implanting hydrogen from the upper surface 21 of the semiconductor substrate 10. By a heat treatment on the semiconductor substrate 10, the hydrogen implanted into the first region 270 diffuses up to a boundary between the gate trench portion 40 and the base region 14. This makes it possible for the hydrogen to terminate the recombination center at the boundary. The boundary functions as a channel of the transistor portion 70. Therefore, when a concentration of the recombination center at the boundary varies, a variation in a threshold voltage of the transistor portion 70 may occur. In the present example, the concentration of the recombination center at the boundary can be made to be low, and thus a variation in the concentration of the recombination center can be made to be small, and the variation in the threshold voltage of the transistor portion 70 can be made to be small.

Note that when the first region 270 is provided in the base region 14, it is preferable to control a dose of hydrogen such that the first region 270 does not become a region of the N type. A ratio by which the implanted hydrogen serves as a hydrogen donor is about 0.1% to 10%. A hydrogen chemical concentration of the first region 270 at the first depth position Z1 may be 10 times or less, one times or less, or 1/10 or less of a chemical concentration of a dopant of the P type (for example, boron) at the position. The hydrogen chemical concentration of the first region 270 at the first depth position Z1 may be 0.001 times or more, 0.01 times or more, 0.1 times or more, or one times or more of the chemical concentration of the dopant of the P type (for example, boron) at the position.

Some mesa portion (some mesa portion 61 in the present example) in which the first region 270 is not provided may be provided with a second region 260. The second region 260 is a region where the hydrogen chemical concentration at the first depth position Z1 is lower than that of the first region 270. As the hydrogen chemical concentration of each region, a hydrogen chemical concentration at the center of a width direction of the mesa portion may be used. In the mesa portion 61 provided with the second region 260, the second region 260 may have the same hydrogen concentration as other regions except the first region 270, and may have a higher hydrogen concentration than those of the other regions except the first region 270. An example of the other regions except the first region 270 is the drift region 18. The second region 260 may be a partial region of the base region 14. The second region 260 may be provided in the mesa portion 60 or the mesa portion 61 which is in contact with and interposed between each of two dummy trench portions 30 that are adjacent to each other.

The first region 270 of the present example is provided in at least some mesa portion 60 in the transistor portion 70. The second region 260 of the present example is provided in each mesa portion 61 in the diode portion 80. Among the mesa portions 60 in the transistor portion 70, one or more mesa portions 60 closest to the diode portion 80 may be provided with the second region 260. Among the mesa portions 60, the mesa portion 60 in contact with the gate trench portion 40 may be provided with the first region 270, and the mesa portion 60 not in contact with the gate trench portion 40 may be provided with the second region 260.

Figure 4:
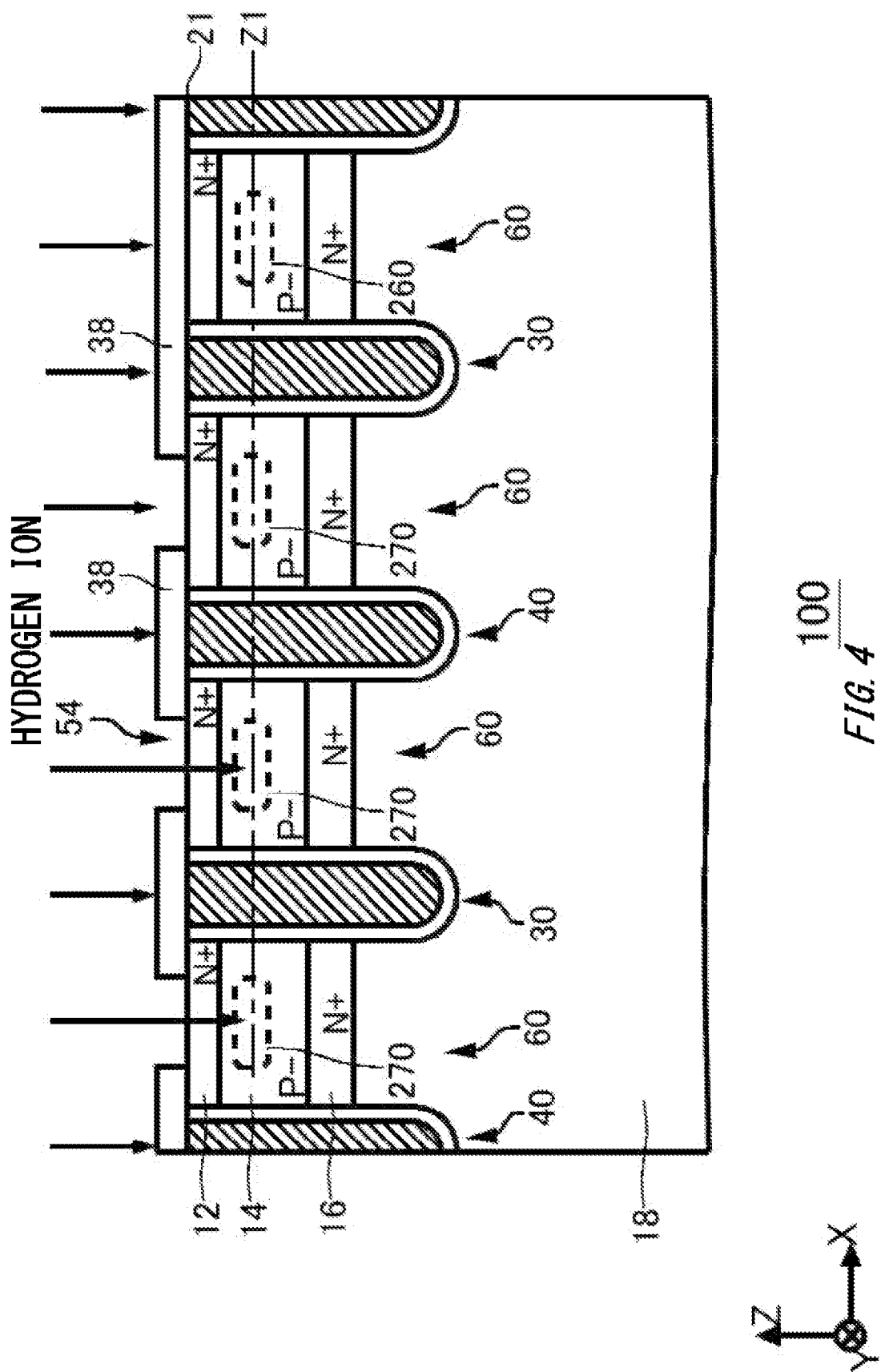
FIG. 4 is a figure showing an example of a manufacturing method for the semiconductor device 100 shown in FIG. 3.

FIG. 4 is a figure showing an example of a manufacturing method for the semiconductor device 100 shown in FIG. 3. In the present example, hydrogen ions are implanted at the first depth position Z1 from the upper surface 21 of the semiconductor substrate 10. Note that before the hydrogen ions are implanted, each trench portion, the emitter region 12, the base region 14, the accumulation region 16, the drift region 18, the buffer region 20, the collector region 22, and the cathode region 82 may be formed in the semiconductor substrate 10.

Further, before the hydrogen ions are implanted, the interlayer dielectric film 38 may be provided. The interlayer dielectric film 38 may function as a mask that blocks the hydrogen ions. In the interlayer dielectric film 38, the contact hole 54 may be formed. Note that above the mesa portion in which the first region 270 is not formed, the contact hole 54 may not be formed. In a step after the hydrogen ions are implanted, the contact hole 54 may be formed above the mesa portion. In this way, the hydrogen ions are implanted into the first region 270, and the hydrogen ions can be blocked for the second region 260. In another example, the hydrogen ions may be implanted into the second region 260 by a dose (/$cm^2$) which is smaller than that for the first region 270. As a mask for blocking the hydrogen ions in another example, a resist formed by photolithography may be used. An opening portion of the mask made of the resist may be formed to be away from an inversion layer channel forming region of the gate trench portion 40 in the top plan view.

After the hydrogen ions are implanted, the semiconductor substrate 10 is heat treated. In a heat treatment step, the semiconductor substrate 10 is heat treated on condition that the hydrogen implanted into the first region 270 diffuses up to the boundary between the base region 14 and the gate trench portion 40. In this way, the concentration of the recombination center at the boundary is reduced. Therefore, it is possible to adjust the threshold voltage of the semiconductor device 100.

Figure 5:
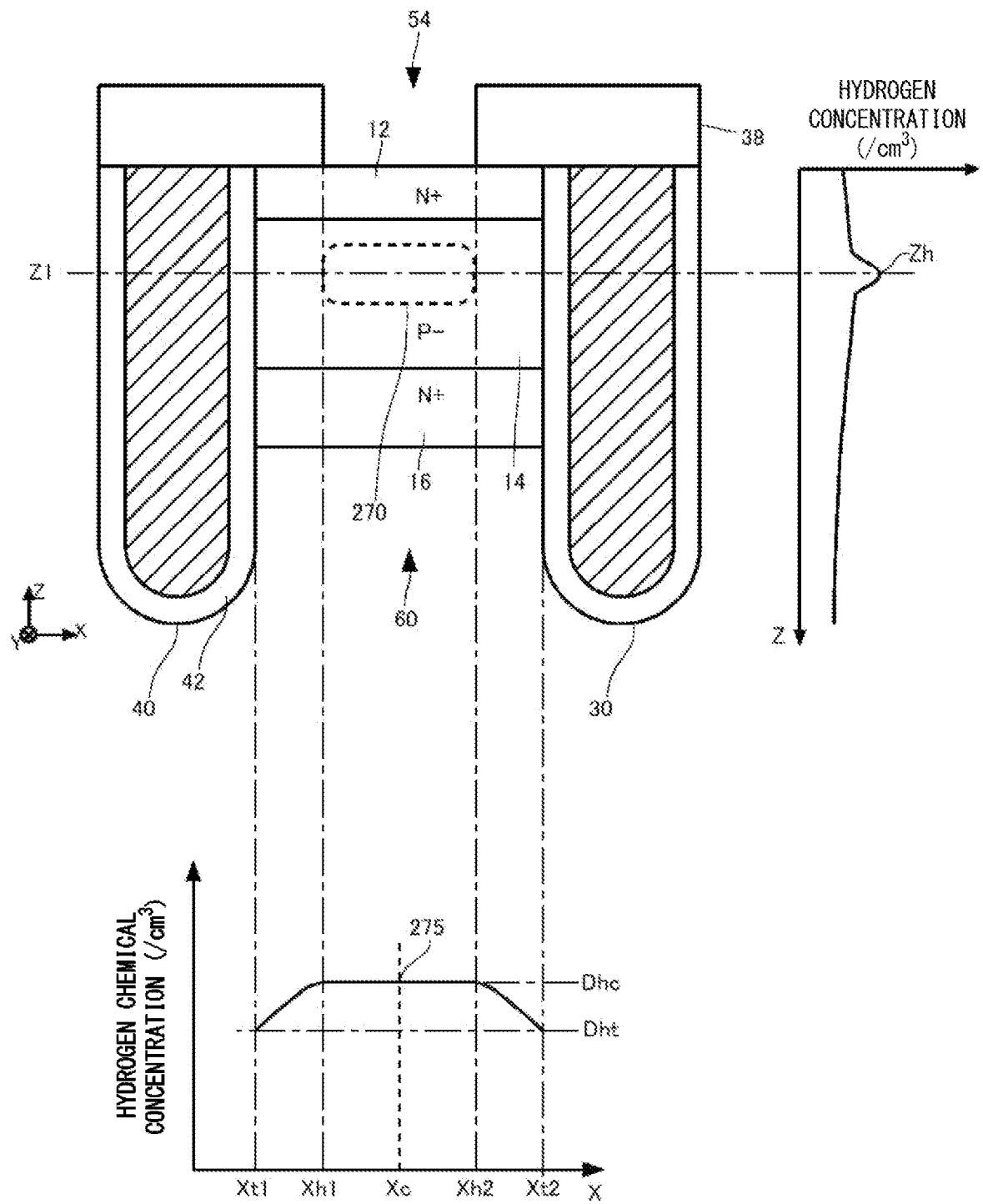
FIG. 5 schematically shows a mesa portion 60 provided with a first region 270, and a hydrogen chemical concentration distribution in an X axis direction and a Z axis direction.

FIG. 5 schematically shows a mesa portion 60 provided with a first region 270, and a hydrogen chemical concentration distribution in an X axis direction and a Z axis direction. The hydrogen chemical concentration distribution in the X axis direction is a distribution at the first depth position Z1 of the mesa portion 60. The hydrogen chemical concentration distribution in the Z axis direction is a distribution at a center position Xc of the mesa portion 60 in the X axis direction. At the first depth position Z1 as described above, the hydrogen chemical concentration distribution in the Z axis direction indicates a concentration peak Zh. Each concentration distribution shows a distribution after the heat treatment. By the heat treatment, the hydrogen implanted at the first depth position Z1 diffuses in each direction.

In the present example, positions in the X axis direction at which the base region 14 and each trench portion are in contact with each other are set as Xt1 and Xt2. Further, positions of both ends of the contact hole 54 in the X axis direction are set as Xh1 and Xh2. In the present example, the hydrogen ions are implanted at the first depth position Z1 via the contact hole 54. Therefore, the first region 270 is provided below the contact hole 54. The first region 270 may be a region having the same position as the contact hole 54 in an XY plane. The first region 270 may not be a region having the same position as the contact hole 54 in an XY plane, as in a case where an angle at which the hydrogen ions are implanted is not perpendicular to the substrate 10. When using a mask made of a resist, in a case where an opening of the mask is narrower than the contact hole 54, the first region 270 may be formed to be narrower than the contact hole 54. The hydrogen chemical concentration distribution in the X axis direction may have a concentration peak 275 below the contact hole 54. The concentration peak 275 may be arranged at the center position Xc of the mesa portion 60. Below the contact hole 54, the hydrogen chemical concentration at the first depth position Z1 may approximately be uniform. In this case, as a peak value of the hydrogen chemical concentration distribution in the X axis direction, a hydrogen chemical concentration at the center position Xc may be used.

On the other hand, since the gate dielectric film 42 is covered with the interlayer dielectric film 38, the hydrogen ions are not implanted. Therefore, it is possible to suppress damage to the gate dielectric film 42. Further, the hydrogen implanted at the first region 270 diffuses in the heat treatment step, and reaches the positions Xt1 and Xt2. This makes it possible for the hydrogen to terminate the recombination centers existing at positions Xt1 and Xt2. Since concentrations of the recombination centers existing at the positions Xt1 and Xt2 are reduced, variations in the concentrations of the recombination centers can be made to be small. Therefore, even in a case where the concentration of the recombination center varies before the diffusion of the hydrogen, the variation in characteristics such as the threshold voltage can be reduced.

A hydrogen chemical concentration Dht at the position Xt1 at which the gate trench portion 40 and the base region 14 are in contact with each other may be lower than a hydrogen chemical concentration Dhc at the concentration peak 275. In the present example, the hydrogen chemical concentration Dht is lower than the hydrogen chemical concentration Dhc. The hydrogen chemical concentration Dht may be ¾ or less, or ½ or less of the hydrogen chemical concentration Dhc. The hydrogen chemical concentration Dht may be 1/10 or more, 1/5 or more, or 1/3 or more of the hydrogen chemical concentration Dhc. The hydrogen chemical concentration Dht can be controlled by a width of the contact hole 54 in the X axis direction, a dose of the hydrogen ion, and the like. As described above, by making the hydrogen chemical concentration Dht be high, the variation in characteristics such as the threshold voltage can be reduced. A length (Xh1-Xt1) by which the interlayer dielectric film 38 protrudes further than the gate trench portion 40 in the X axis direction may be 10% or more, 20% or more, 30% or more, or 40% or more of a width (Xt2-Xt1) of the mesa portion 60 in the X axis direction. A length (Xt2-Xh2) by which the interlayer dielectric film 38 protrudes further than the dummy trench portion 30 in the X axis direction may be the same as the above described length (Xh1-Xt1).

Note that the position Xt2 at which the dummy trench portion 30 and the base region 14 are in contact with each other may also have the hydrogen chemical concentration Dht similar to that at the position Xt1. In another example, the hydrogen chemical concentration at the position Xt2 at which the dummy trench portion 30 and the base region 14 are in contact with each other may be different from the hydrogen chemical concentration Dht at the position Xt1. Further, a width of the first region 270 in the X axis direction may be the same as the width of the contact hole 54 in the X axis direction. Alternatively, the width of the first region 270 in the X axis direction may be 80% or more, or 90% or more of the width of the contact hole 54 in the X axis direction. The width of the first region 270 in the X axis direction may be 100% or less of the width of the contact hole 54 in the X axis direction.

Note that in the depth direction from the upper surface 21 of the semiconductor substrate 10 (a direction on a negative side of the Z axis), a lower end of the first region 270 on a lower surface 23 side may be deeper than the lower end of the base region 14 on the lower surface 23 side. In this case, the first region 270 overlaps the accumulation region 16 in the depth direction in the present example. Alternatively, an upper end of the first region 270 on the upper surface 21 side may be deeper than the lower end of the base region 14 on the lower surface 23 side. In this case, the first region 270 overlaps the accumulation region 16 or the drift region 18 in the depth direction in the present example. On the other hand, the upper end of the first region 270 on the upper surface 21 side may be located to be closer to the upper surface 21 side than the depth position of the lower end of the trench portion on the lower surface 23 side is. The trench portion may be the gate trench portion 40 or the dummy trench portion 30. The lower end of the first region 270 on the lower surface 23 side may be located to be closer to the upper surface 21 side than the depth position of the lower end of the trench portion on the lower surface 23 side is. The upper end of the first region 270 on the upper surface 21 side may be located to be closer to the upper surface 21 side than a depth position of a lower end of the accumulation region 16 on the lower surface 23 side is. The lower end of the first region 270 on the lower surface 23 side may be located to be closer to the upper surface 21 side than the depth position of the lower end of the accumulation region 16 on the lower surface 23 side is. The upper end of the first region 270 on the upper surface 21 side may be located to be closer to the upper surface 21 side than a depth position of the lower end of the base region 14 on the lower surface 23 side is. The lower end of the first region 270 on the lower surface 23 side may be located to be closer to the upper surface 21 side than the depth position of the lower end of the base region 14 on the lower surface 23 side is.

The first depth position Z1 in the first region 270 may be located to be closer to the upper surface 21 side than the depth position of the lower end of the trench portion on the lower surface 23 side is. The trench portion may be the gate trench portion 40 or the dummy trench portion 30.

The first depth position Z1 in the first region 270 may be located to be closer to the lower surface 23 side than the depth position of the lower end of the accumulation region 16 on the lower surface 23 side is. The first depth position Z1 in the first region 270 may be located to be closer to the upper surface 21 side than the depth position of the lower end of the accumulation region 16 on the lower surface 23 side is. The first depth position Z1 in the first region 270 may be located to be closer to the lower surface 23 side than a depth position of an upper end of the accumulation region 16 on the upper surface 21 side is. The first depth position Z1 in the first region 270 may be located to be closer to the upper surface 21 side than the depth position of the upper end of the accumulation region 16 on the upper surface 21 side is.

The first depth position Z1 in the first region 270 may be located to be closer to the lower surface 23 side than the depth position of the lower end of the base region 14 on the lower surface 23 side is. The first depth position Z1 in the first region 270 may be located to be closer to the upper surface 21 side than the depth position of the lower end of the base region 14 on the lower surface 23 side is. The first depth position Z1 in the first region 270 may be located to be closer to the lower surface 23 side than a depth position of an upper end of the base region 14 on the upper surface 21 side is. The first depth position Z1 in the first region 270 may be located to be closer to the upper surface 21 side than the depth position of the upper end of the base region 14 on the upper surface 21 side is.

Figure 6:
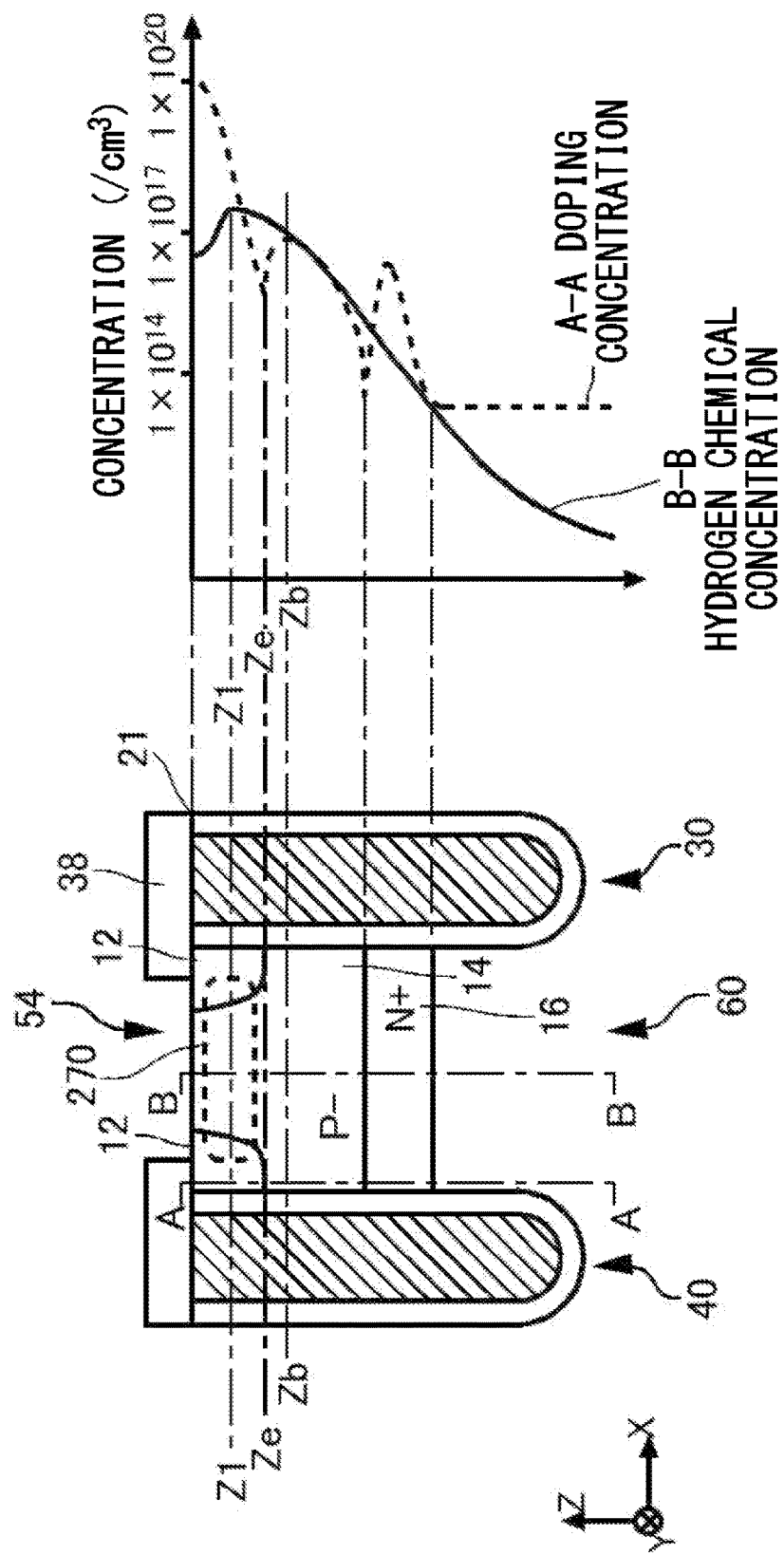
FIG. 6 is a figure showing another structural example of the mesa portion 60 provided with the first region 270.

FIG. 6 is a figure showing another structural example of the mesa portion 60 provided with the first region 270. In the mesa portion 60 of the present example, the emitter regions 12 are arranged at both ends of the mesa portion 60 in the X axis direction, and the emitter region 12 is not provided at the center of the mesa portion 60 in the X axis direction. The emitter region 12 is provided in a region in contact with each trench portion. On the upper surface 21 of the semiconductor substrate 10, the base region 14 is provided between the emitter regions 12 at both ends of the mesa portion 60. Structures other than the emitter region 12 and the base region 14 are similar to those of any of the mesa portions 60 described in FIG. 1 to FIG. 5.

In the present example, a depth position of a lower end of the emitter region 12 is set as Ze. The emitter region 12 is a high concentration region having a higher doping concentration than that of the base region 14. The emitter region 12 of the present example may have a concentration peak of a donor such as phosphorus or arsenic other than a hydrogen donor. The first depth position Z1 in the first region 270 is arranged above the depth position Ze. As described above, the first depth position Z1 is a position having a peak of the hydrogen chemical concentration distribution in the depth direction.

Next to the structural figure of FIG. 6, a distribution figure shows a doping concentration in a cross section A-A, and a hydrogen chemical concentration in a cross section B-B. The cross section A-A corresponds to a YZ plane passing through a portion of the mesa portion 60, the portion being in contact with a side wall of the gate trench portion 40. The cross section B-B corresponds to a YZ plane passing through the center position of the mesa portion 60 in the X axis direction. In the cross section A-A, a depth at a peak position of a doping concentration of the base region 14 is set as Zb. The depth position Zb is deeper than the depth position Z1. Further, a hydrogen chemical concentration at the depth position Zb in the cross section B-B may be higher, or lower than a doping concentration of the base region 14 at the depth position Zb in the cross section A-A. In the present example, the hydrogen chemical concentration at the depth position Zb in the cross section B-B is higher than the doping concentration of the base region 14 at the depth position Zb in the cross section A-A. In this case, in the cross section A-A, a hydrogen chemical concentration at a peak position of the doping concentration of the base region 14 can be made to be sufficiently high.

The first region 270 of the present example is provided in the base region 14 that is interposed between the emitter regions 12 arranged at both ends of the mesa portion 60 in the X axis direction, and the emitter region 12. In the present example as well, the hydrogen chemical concentration distribution at the first depth position Z1 is similar to that of the example described in FIG. 5. In the present example as well, it is possible to reduce the variation in characteristics such as the threshold voltage by the hydrogen diffusing up to the interface between the base region 14 and the gate trench portion 40. Further, in FIG. 6, the first region 270 is provided across the base region 14 and the emitter region 12, but when a resist mask that is narrower than the contact hole 54 is used, it is also possible to provide the first region 270 only in the base region 14. Further, the first depth position Z1 in the first region 270 may be arranged below the depth position Ze, and a part or the entirety of the first region 270 may be arranged below the depth position Ze. Further, in the depth direction from the upper surface 21 of the semiconductor substrate 10 (the direction on the negative side of the Z axis), the lower end of the first region 270 on the lower surface 23 side may be deeper than the lower end of the base region 14 on the lower surface 23 side. In this case, the first region 270 overlaps the accumulation region 16 in the depth direction in the present example. Alternatively, the upper end of the first region 270 on the upper surface 21 side may be deeper than the lower end of the base region 14 on the lower surface 23 side. In this case, the first region 270 overlaps the accumulation region 16 or the drift region 18 in the depth direction in the present example.

On the other hand, the upper end of the first region 270 on the upper surface 21 side may be located to be closer to the upper surface 21 side than the depth position of the lower end of the trench portion on the lower surface 23 side is. The trench portion may be the gate trench portion 40 or the dummy trench portion 30. The lower end of the first region 270 on the lower surface 23 side may be located to be closer to the upper surface 21 side than the depth position of the lower end of the trench portion on the lower surface 23 side is. The upper end of the first region 270 on the upper surface 21 side may be located to be closer to the upper surface 21 side than the depth position of the lower end of the accumulation region 16 on the lower surface 23 side is. The lower end of the first region 270 on the lower surface 23 side may be located to be closer to the upper surface 21 side than the depth position of the lower end of the accumulation region 16 on the lower surface 23 side is. The upper end of the first region 270 on the upper surface 21 side may be located to be closer to the upper surface 21 side than the depth position of the lower end of the base region 14 on the lower surface 23 side is. The lower end of the first region 270 on the lower surface 23 side may be located to be closer to the upper surface 21 side than the depth position of the lower end of the base region 14 on the lower surface 23 side is.

The first depth position Z1 in the first region 270 may be located to be closer to the upper surface 21 side than the depth position of the lower end of the trench portion on the lower surface 23 side is. The trench portion may be the gate trench portion 40 or the dummy trench portion 30.

The first depth position Z1 in the first region 270 may be located to be closer to the lower surface 23 side than the depth position of the lower end of the accumulation region 16 on the lower surface 23 side is. The first depth position Z1 in the first region 270 may be located to be closer to the upper surface 21 side than the depth position of the lower end of the accumulation region 16 on the lower surface 23 side is. The first depth position Z1 in the first region 270 may be located to be closer to the lower surface 23 side than the depth position of the upper end of the accumulation region 16 on the upper surface 21 side is. The first depth position Z1 in the first region 270 may be located to be closer to the upper surface 21 side than the depth position of the upper end of the accumulation region 16 on the upper surface 21 side is.

The first depth position Z1 in the first region 270 may be located to be closer to the lower surface 23 side than the depth position of the lower end of the base region 14 on the lower surface 23 side is. The first depth position Z1 in the first region 270 may be located to be closer to the upper surface 21 side than the depth position of the lower end of the base region 14 on the lower surface 23 side is. The first depth position Z1 in the first region 270 may be located to be closer to the lower surface 23 side than the depth position of the upper end of the base region 14 on the upper surface 21 side is. The first depth position Z1 in the first region 270 may be located to be closer to the upper surface 21 side than the depth position of the upper end of the base region 14 on the upper surface 21 side is.

Figure 7:
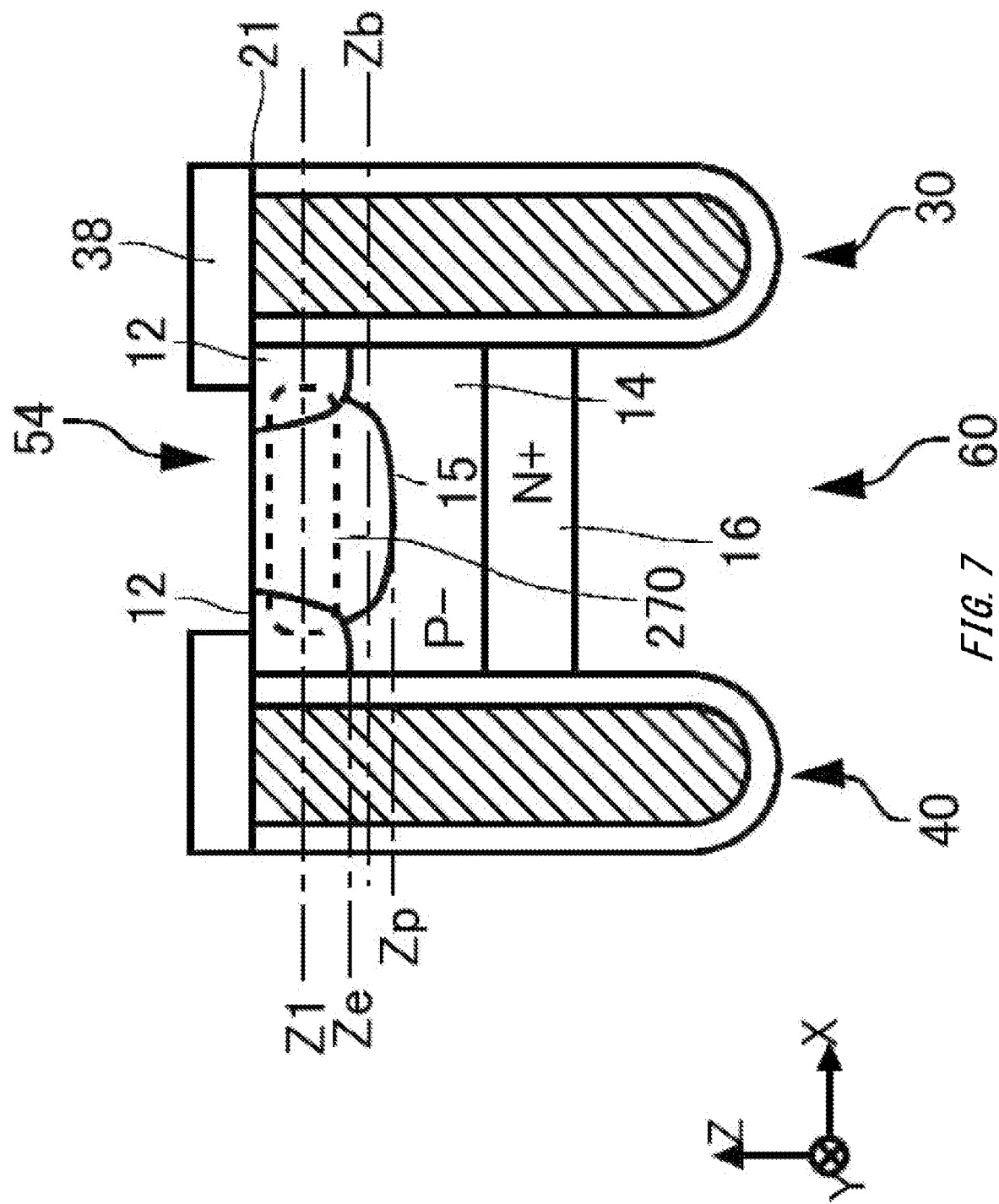
FIG. 7 is a figure showing another structural example of the mesa portion 60 provided with the first region 270.

FIG. 7 is a figure showing another structural example of the mesa portion 60 provided with the first region 270. In the mesa portion 60 of the present example, the contact region 15 of the P type is exposed on the upper surface 21 of the mesa portion 60. Structures other than the contact region 15 are similar to those of any of the mesa portions 60 described in FIG. 1 to FIG. 5. The contact region 15 is a high concentration region that has a higher doping concentration than that of the base region 14. The contact region 15 may have a concentration peak of a dopant of the P type such as boron. At both ends of the mesa portion 60 in the X axis direction, the emitter regions 12 may be provided, similarly to the example of FIG. 6. In another example, the contact region 15 may be provided in the entire mesa portion 60 in the X axis direction.

In the present example, a depth position of a lower end of the contact region 15 is set as Zp. The first depth position Z1 in the first region 270 is arranged above the depth position Zp. The first depth position Z1 in the first region 270 may be arranged above the depth position Ze. The depth position Ze of the present example is arranged above the depth position Zp.

The first region 270 of the present example is provided across the contact region 15 and the emitter region 12. In the present example as well, the hydrogen chemical concentration distribution at the first depth position Z1 is similar to that of the example described in FIG. 5. In the present example as well, it is possible to reduce the variation in characteristics such as the threshold voltage by the hydrogen diffusing up to the interface between the base region 14 and the gate trench portion 40. Further, in FIG. 7, the first region 270 is provided across the contact region 15 and the emitter region 12, but when a resist mask that is narrower than the contact hole 54 is used, it is also possible to provide the first region 270 only in the contact region 15. Further, the first depth position Z1 in the first region 270 may be arranged below the depth positions Ze, Zp, and a part or the entirety of the first region 270 may be arranged below the depth positions Ze, Zp. Further, in the depth direction from the upper surface 21 of the semiconductor substrate 10 (the direction on the negative side of the Z axis), the lower end of the first region 270 on the lower surface 23 side may be deeper than the lower end of the base region 14 on the lower surface 23 side. In this case, the first region 270 overlaps the accumulation region 16 in the depth direction in the present example. Alternatively, the upper end of the first region 270 on the upper surface 21 side may be deeper than the lower end of the base region 14 on the lower surface 23 side. In this case, the first region 270 overlaps the accumulation region 16 or the drift region 18 in the depth direction in the present example.

On the other hand, the upper end of the first region 270 on the upper surface 21 side may be located to be closer to the upper surface 21 side than the depth position of the lower end of the trench portion on the lower surface 23 side is. The trench portion may be the gate trench portion 40 or the dummy trench portion 30. The lower end of the first region 270 on the lower surface 23 side may be located to be closer to the upper surface 21 side than the depth position of the lower end of the trench portion on the lower surface 23 side is. The upper end of the first region 270 on the upper surface 21 side may be located to be closer to the upper surface 21 side than the depth position of the lower end of the accumulation region 16 on the lower surface 23 side is. The lower end of the first region 270 on the lower surface 23 side may be located to be closer to the upper surface 21 side than the depth position of the lower end of the accumulation region 16 on the lower surface 23 side is. The upper end of the first region 270 on the upper surface 21 side may be located to be closer to the upper surface 21 side than the depth position of the lower end of the base region 14 on the lower surface 23 side is. The lower end of the first region 270 on the lower surface 23 side may be located to be closer to the upper surface 21 side than the depth position of the lower end of the base region 14 on the lower surface 23 side is.

The first depth position Z1 in the first region 270 may be located to be closer to the upper surface 21 side than the depth position of the lower end of the trench portion on the lower surface 23 side is. The trench portion may be the gate trench portion 40 or the dummy trench portion 30.

The first depth position Z1 in the first region 270 may be located to be closer to the lower surface 23 side than the depth position of the lower end of the accumulation region 16 on the lower surface 23 side is. The first depth position Z1 in the first region 270 may be located to be closer to the upper surface 21 side than the depth position of the lower end of the accumulation region 16 on the lower surface 23 side is. The first depth position Z1 in the first region 270 may be located to be closer to the lower surface 23 side than the depth position of the upper end of the accumulation region 16 on the upper surface 21 side is. The first depth position Z1 in the first region 270 may be located to be closer to the upper surface 21 side than the depth position of the upper end of the accumulation region 16 on the upper surface 21 side is.

The first depth position Z1 in the first region 270 may be located to be closer to the lower surface 23 side than the depth position of the lower end of the base region 14 on the lower surface 23 side is. The first depth position Z1 in the first region 270 may be located to be closer to the upper surface 21 side than the depth position of the lower end of the base region 14 on the lower surface 23 side is. The first depth position Z1 in the first region 270 may be located to be closer to the lower surface 23 side than the depth position of the upper end of the base region 14 on the upper surface 21 side is. The first depth position Z1 in the first region 270 may be located to be closer to the upper surface 21 side than the depth position of the upper end of the base region 14 on the upper surface 21 side is.

Note that in the Z axis direction, a distance between the first depth position Z1, which is described in FIG. 1 to FIG. 7, and the upper surface 21 of the semiconductor substrate 10 may be 1 μm or less. By making the distance small, damage when the hydrogen ion is implanted at the first depth position Z1 can be made to be small. The distance may be 0.5 μm or less. When the hydrogen ion is implanted, a mask such as a thin resist may be formed on the upper surface 21 of the semiconductor substrate 10 to adjust a range of the hydrogen ion.

Figure 8:
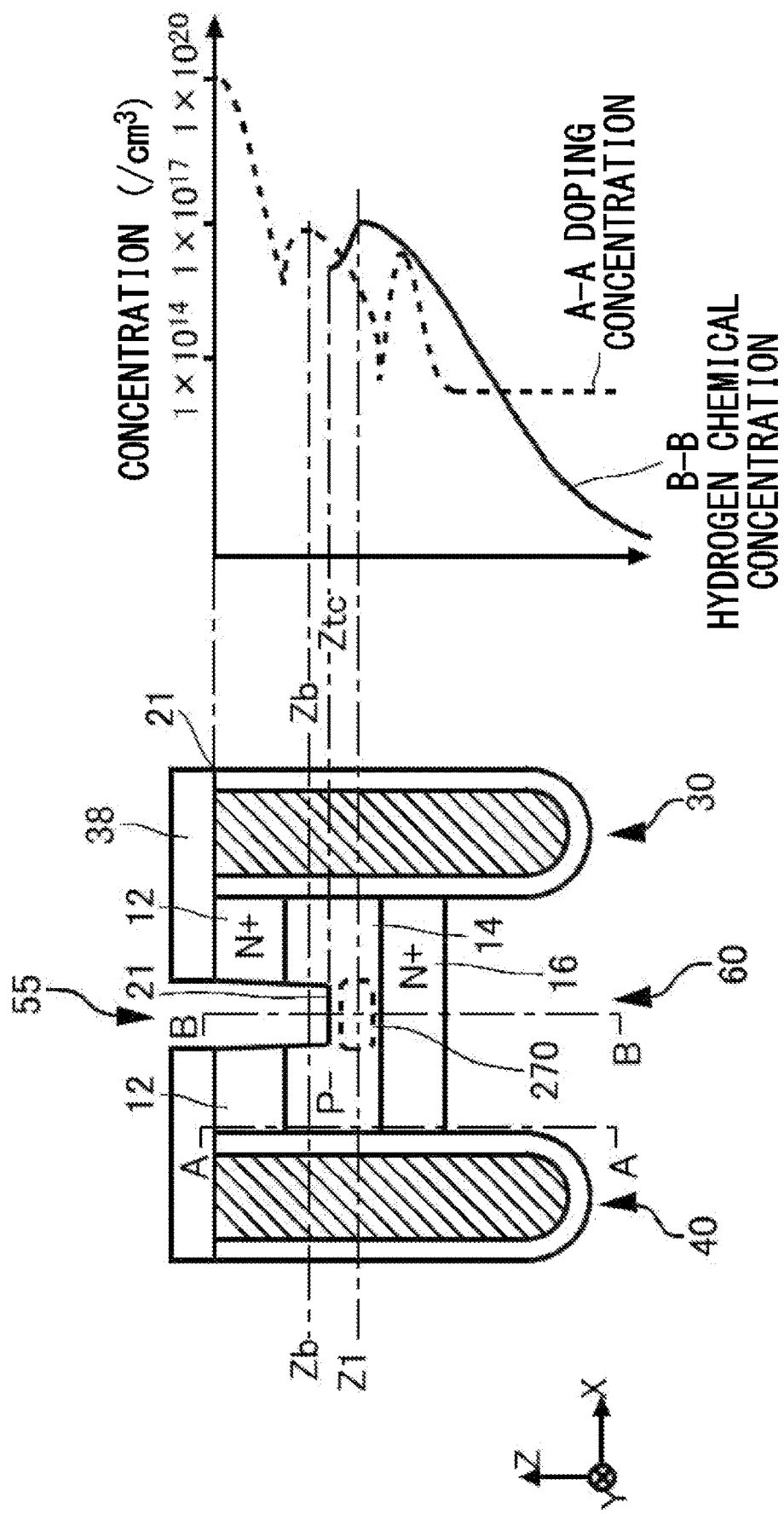
FIG. 8 is a figure showing another structural example of the mesa portion 60 provided with the first region 270.

FIG. 8 is a figure showing another structural example of the mesa portion 60 provided with the first region 270. The mesa portion 60 of the present example has a trench contact 55. Structures other than the trench contact 55 are similar to those of any of the mesa portions 60 described in FIG. 1 to FIG. 7. The trench contact 55 is a groove that is formed from the upper surface 21 of the semiconductor substrate 10 up to a position reaching the base region 14. In the mesa portion 60 of the present example, the emitter region 12 is provided between the base region 14 and the upper surface 21, and the trench contact 55 passes through the emitter region 12. Inside the trench contact 55, a plug of a metal material such as tungsten may be formed. The trench contact 55 may be arranged at the center of the mesa portion 60 in the X axis direction. The interlayer dielectric film 38 may cover a region where the trench contact 55 is not provided.

The first region 270 is arranged below the trench contact 55. The first depth position Z1 of the first region 270 may be arranged in the base region 14. By implanting the hydrogen ions via the trench contact 55 before inserting a metal material such as tungsten into the trench contact 55, it is possible to form the first region 270 below the trench contact 55. In this case, a bottom surface of the trench contact 55 is the upper surface 21 which is an implantation surface for the hydrogen ion. A depth position of the bottom surface of the trench contact 55 is set as Ztc. A distance between the depth position Ztc and the first depth position Z1 of the first region 270 in the Z axis direction may be 1 μm or less, and may be 0.5 μm or less.

Next to the structural figure of FIG. 8, a distribution figure shows a doping concentration in a cross section A-A, and a hydrogen chemical concentration in a cross section B-B. The cross section A-A corresponds to a YZ plane passing through a portion of the mesa portion 60, the portion being in contact with the side wall of the gate trench portion 40. The cross section B-B corresponds to a YZ plane passing through the center position of the mesa portion 60 in the X axis direction. In the cross section A-A, a depth at a peak position of a doping concentration of the base region 14 is set as Zb. The depth position Zb is shallower than the depth position Z1. Further, the depth position Z1 may be deeper than the depth position Ztc. Note that the depth position Zb may be shallower or deeper than the depth position Ztc. In the present example, the depth position Zb is shallower than the depth position Ztc. A hydrogen chemical concentration at the depth position Z1 in the cross section B-B may be higher than a doping concentration of the base region 14 at the depth position Zb in the cross section A-A. Further, when the depth position Zb is deeper than the depth position Ztc, a hydrogen chemical concentration at the depth position Zb in the cross section B-B may be higher than a doping concentration of the base region 14 at the depth position Zb in the cross section A-A. In this case, in the cross section A-A, a hydrogen chemical concentration at a peak position of the doping concentration of the base region 14 can be made to be sufficiently high. The hydrogen chemical concentration at the depth position Z1 in the cross section B-B may be higher than a doping concentration of the base region 14 at the depth position Z1 in the cross section A-A. Note that when the trench contact 55 tapers or the like, the first region 270 may be provided across the base region 14 and the emitter region 12. Further, the contact region 15 may be provided on a side wall and a bottom portion of the trench contact 55, and the first region 270 may be provided to overlap the contact region 15. Further, in the depth direction from the upper surface 21 of the semiconductor substrate 10 (the direction on the negative side of the Z axis), the lower end of the first region 270 on the lower surface 23 side may be deeper than the lower end of the base region 14 on the lower surface 23 side. In this case, the first region 270 overlaps the accumulation region 16 in the depth direction in the present example. Alternatively, the upper end of the first region 270 on the upper surface 21 side may be deeper than the lower end of the base region 14 on the lower surface 23 side. In this case, the first region 270 overlaps the accumulation region 16 or the drift region 18 in the depth direction in the present example.

On the other hand, the upper end of the first region 270 on the upper surface 21 side may be located to be closer to the upper surface 21 side than the depth position of the lower end of the trench portion on the lower surface 23 side is. The trench portion may be the gate trench portion 40 or the dummy trench portion 30. The lower end of the first region 270 on the lower surface 23 side may be located to be closer to the upper surface 21 side than the depth position of the lower end of the trench portion on the lower surface 23 side is. The upper end of the first region 270 on the upper surface 21 side may be located to be closer to the upper surface 21 side than the depth position of the lower end of the accumulation region 16 on the lower surface 23 side is. The lower end of the first region 270 on the lower surface 23 side may be located to be closer to the upper surface 21 side than the depth position of the lower end of the accumulation region 16 on the lower surface 23 side is. The upper end of the first region 270 on the upper surface 21 side may be located to be closer to the upper surface 21 side than the depth position of the lower end of the base region 14 on the lower surface 23 side is. The lower end of the first region 270 on the lower surface 23 side may be located to be closer to the upper surface 21 side than the depth position of the lower end of the base region 14 on the lower surface 23 side is.

The first depth position Z1 in the first region 270 may be located to be closer to the upper surface 21 side than the depth position of the lower end of the trench portion on the lower surface 23 side is. The trench portion may be the gate trench portion 40 or the dummy trench portion 30.

The first depth position Z1 in the first region 270 may be located to be closer to the lower surface 23 side than the depth position of the lower end of the accumulation region 16 on the lower surface 23 side is. The first depth position Z1 in the first region 270 may be located to be closer to the upper surface 21 side than the depth position of the lower end of the accumulation region 16 on the lower surface 23 side is. The first depth position Z1 in the first region 270 may be located to be closer to the lower surface 23 side than the depth position of the upper end of the accumulation region 16 on the upper surface 21 side is. The first depth position Z1 in the first region 270 may be located to be closer to the upper surface 21 side than the depth position of the upper end of the accumulation region 16 on the upper surface 21 side is.

The first depth position Z1 in the first region 270 may be located to be closer to the lower surface 23 side than the depth position of the lower end of the base region 14 on the lower surface 23 side is. The first depth position Z1 in the first region 270 may be located to be closer to the upper surface 21 side than the depth position of the lower end of the base region 14 on the lower surface 23 side is. The first depth position Z1 in the first region 270 may be located to be closer to the lower surface 23 side than the depth position of the upper end of the base region 14 on the upper surface 21 side is. The first depth position Z1 in the first region 270 may be located to be closer to the upper surface 21 side than the depth position of the upper end of the base region 14 on the upper surface 21 side is.

Figure 9A:
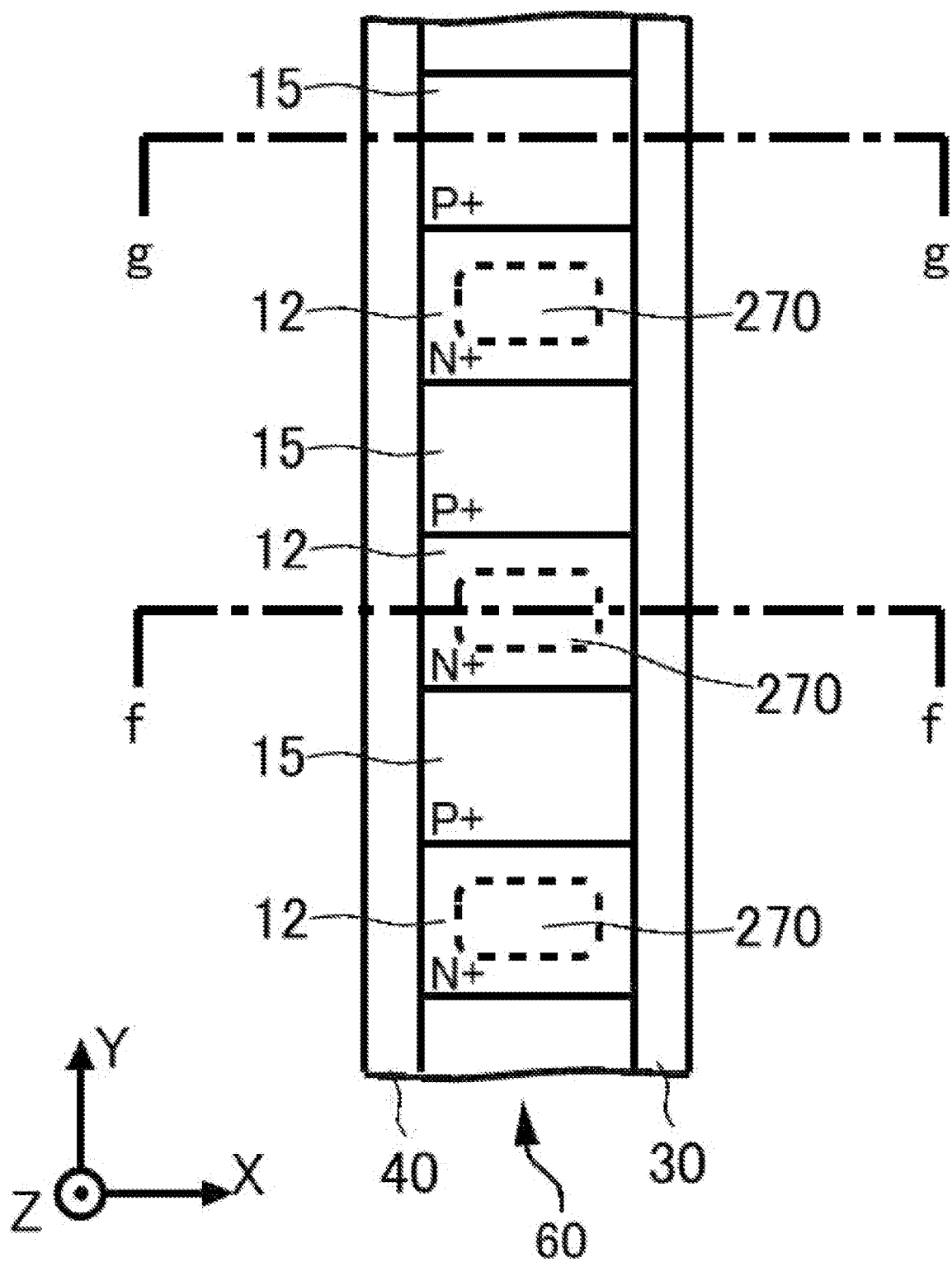
FIG. 9A is an enlarged view of the mesa portion 60 in a top plan view.

FIG. 9A is an enlarged view of the mesa portion 60 in a top plan view. As described in FIG. 2, on the upper surface of the mesa portion 60, the region of the P type and the region of the N type are alternately arranged in the Y axis direction. In the present example, the region of the P type is the contact region 15, and the region of the N type region is the emitter region 12. The structure of the mesa portion 60 is similar to that of any of the mesa portions 60 described in FIG. 1 to FIG. 8. For example, a cross section f-f in FIG. 9A may have a structure similar to that of the example shown in FIG. 5 or FIG. 8.

The first region 270 is arranged to overlap the emitter region 12 and not overlap the contact region 15 in the top plan view. A range of the first region 270 in the top plan view may be a region where the hydrogen chemical concentration at the first depth position Z1 is 80% or more, or 50% or more of the peak concentration. The first region 270 may be in contact with at least one of the gate trench portion 40 and the dummy trench portion 30 in the top plan view.

In the present example, the first region 270 is selectively arranged in the base region 14 below the emitter region 12. Therefore, it is possible to make a total dose of the hydrogen ions be small and to efficiently terminate the recombination center of the base region 14 that functions as a channel. Further, below the contact region 15, the first region 270 is not arranged. Therefore, it is possible to suppress an increase in hydrogen donor concentration below the contact region 15 such that an extraction of a hole via the contact region 15 and the emitter electrode 52 is not hindered.

In another example, the first region 270 may be provided up to a position overlapping the contact region 15. Note that an area where the first region 270 overlaps the emitter region 12 is preferably greater than an area where the first region 270 overlaps the contact region 15.

Figure 9B:
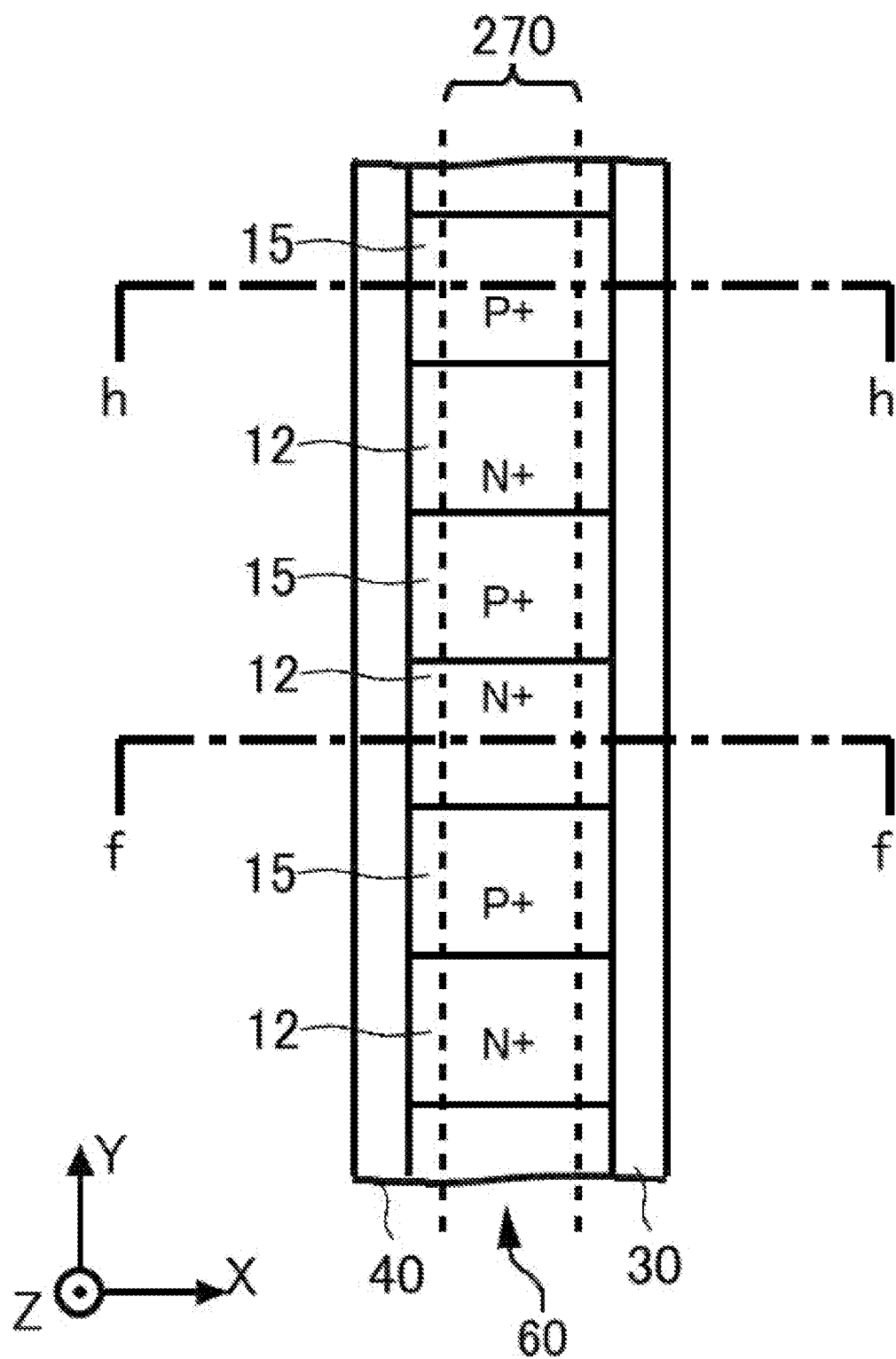
FIG. 9B is another example of the enlarged view of the mesa portion 60 in the top plan view.

FIG. 9B is another example of the enlarged view of the mesa portion 60 in the top plan view. FIG. 9B is different from FIG. 9A in that the first region 270 is provided in both of the emitter region 12 and the contact region 15 that are adjacent to each other. Structures other than the first region 270 are similar to those of the example of FIG. 9A. For example, a structure of the cross section f-f passing through the emitter region 12 may have the same structure as the cross section f-f shown in FIG. 9A. The first region 270 of the present example may be continuously provided over the emitter region 12 and the contact region 15 that are adjacent to each other. The region where the first region 270 is continuously provided may include two or more emitter regions 12. The region where the first region 270 is continuously provided may include two or more contact regions 15.

Figure 9C:
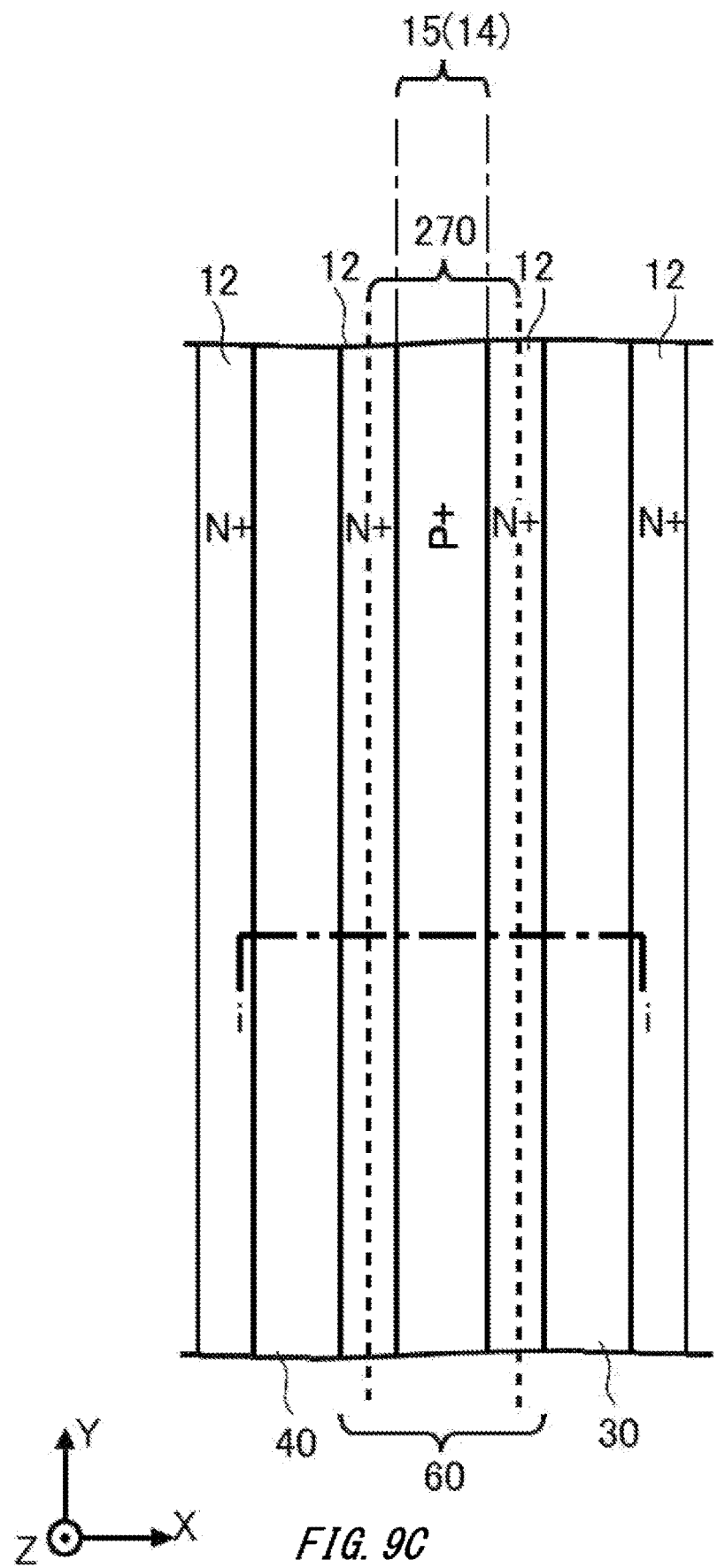
FIG. 9C is another example of the enlarged view of the mesa portion 60 in the top plan view.

FIG. 9C is another example of the enlarged view of the mesa portion 60 in the top plan view. The mesa portion 60 of the present example corresponds to the mesa portion 60 shown in FIG. 6, or FIG. 7, or FIG. 8. Across section i-i in FIG. 9C may have a structure similar to that of the example shown in FIG. 6, or FIG. 7, or FIG. 8.

The mesa portion 60 of the present example has a region of the second conductivity type that is arranged to be away from the trench portion (the gate trench portion 40 and the dummy trench portion 30 in the present example) on the upper surface 21 of the semiconductor substrate 10, and a region of the first conductivity type that is arranged between the trench portion and the region of the second conductivity type on the upper surface 21 of the semiconductor substrate 10.

The region of the second conductivity type is the contact region 15 shown in FIG. 7, or the base region 14 shown in FIG. 6 and FIG. 8. The region of the second conductivity type may be arranged along the trench portion. That is, the region of the second conductivity type may be provided to extend so as to have a longitudinal length in the Y axis direction. The region of the second conductivity type may be arranged to overlap the center of the mesa portion 60 in the X axis direction.

The region of the first conductivity type of the present example is the emitter region 12. The region of the first conductivity type may be arranged along the trench portion. That is, the region of the first conductivity type may be provided to extend in contact with the trench portion so as to have a longitudinal length in the Y axis direction. Regions of the first conductivity type may be arranged such that the region of the second conductivity type is interposed therebetween in the X axis direction. For example, the region of the second conductivity type may be arranged to be away from each trench portion at the center of the mesa portion 60 in the X axis direction, and the regions of the first conductivity type may be arranged on both sides of the region of the second conductivity type in the X axis direction.

The first region 270 is arranged to overlap the region of the second conductivity type in the top plan view. The arrangement of the first region 270 is similar to the example of FIG. 6 or FIG. 7. The first region 270 may be arranged not to overlap the region of the first conductivity type in the top plan view. The first region 270 may be arranged along the trench portion similarly to the region of the second conductivity type. That is, the first region 270 may be provided to extend so as to have a longitudinal length in the Y axis direction. In the top plan view, the first region 270 may be in contact with, or partially overlap the region of the first conductivity type.

Figure 9D:
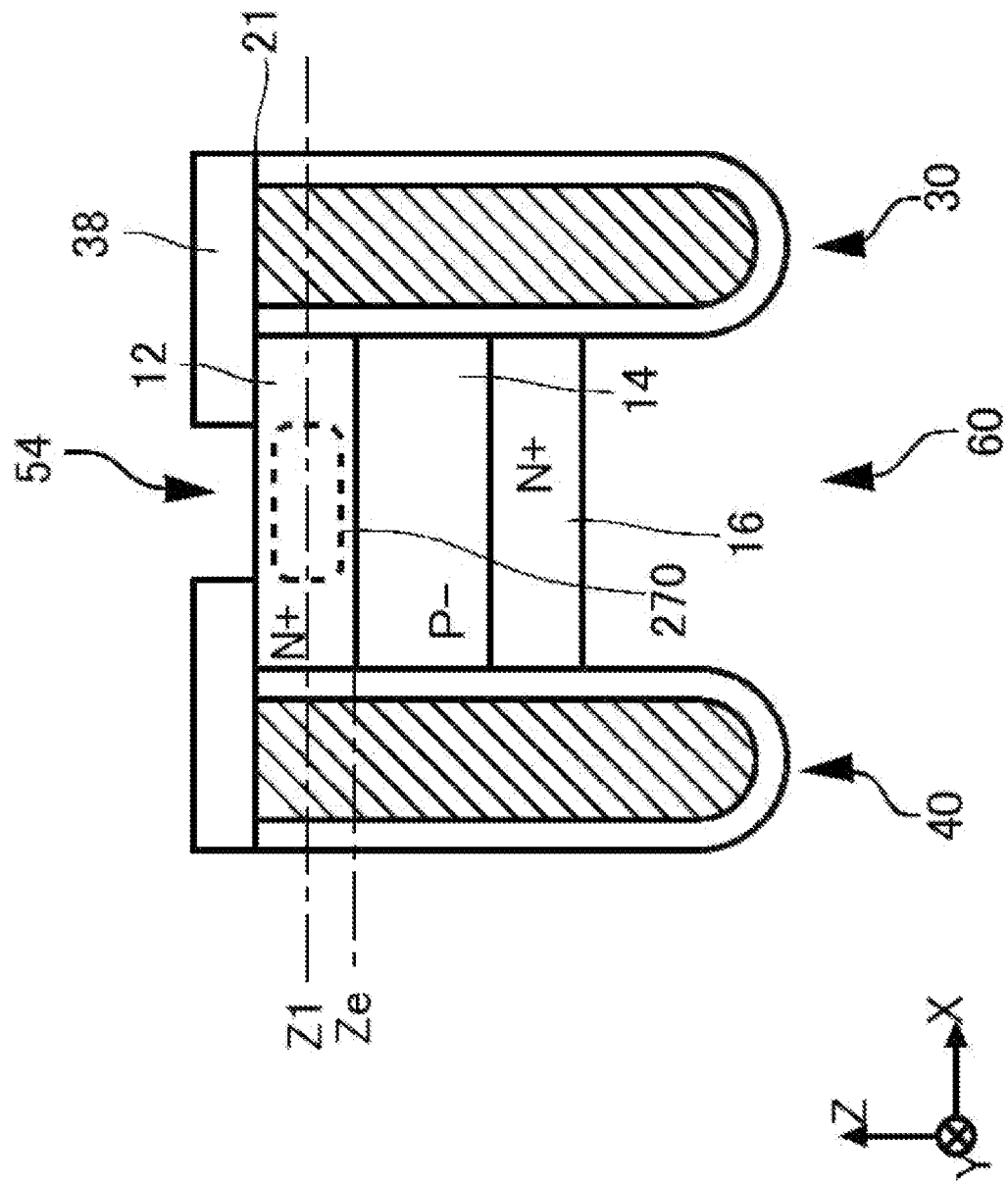
FIG. 9D is a figure showing another example of a cross section f-f in FIG. 9A or FIG. 9B.

FIG. 9D is a figure showing another example of a cross section f-f in FIG. 9A or FIG. 9B. The mesa portion 60 of the present example is different from that of the example of FIG. 5 in depth position of the first region 270. Other structures are similar to those of the mesa portion 60 described in FIG. 5.

At least a part of the first region 270 of the present example is arranged at the same depth as the emitter region 12. The first depth position Z1 may be arranged to be closer to the upper surface 21 side than the depth position Ze of the lower end of the emitter region 12 is. The entire first region 270 may be arranged to be closer to the upper surface 21 side than the depth position Ze of the lower end of the emitter region 12 is, and a part of the first region 270 may be arranged to be closer to the lower surface 23 side than the depth position Ze of the lower end of the emitter region 12 is.

Figure 9E:
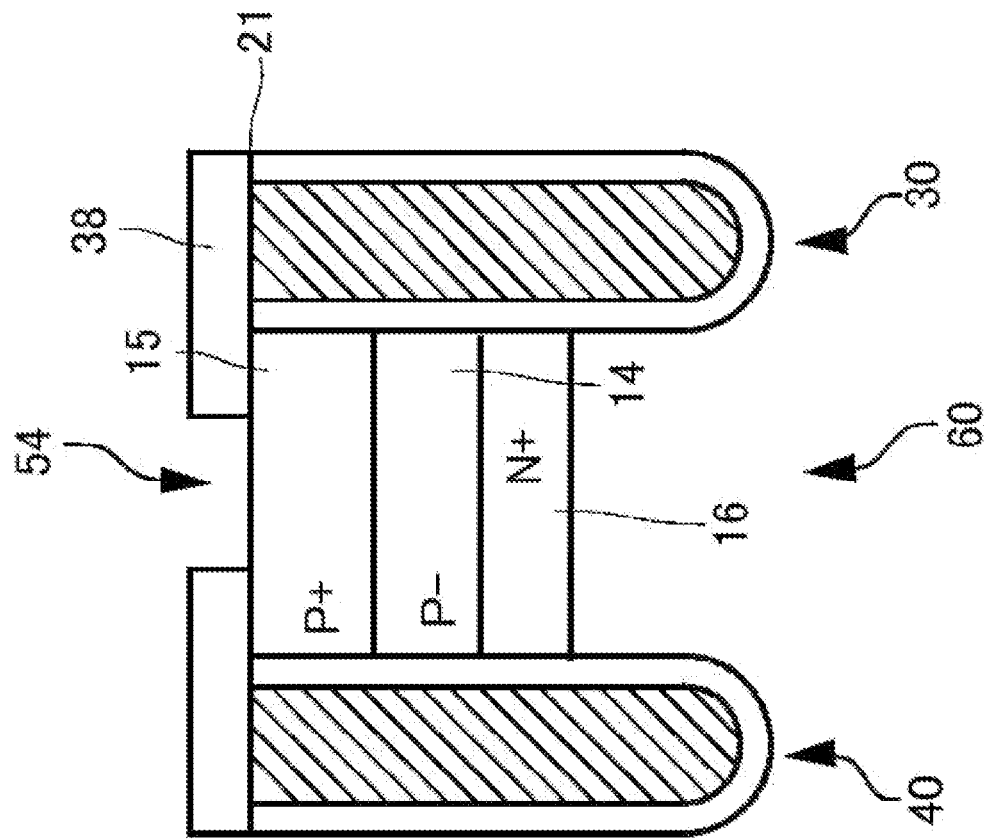
FIG. 9E is a figure showing an example of a cross section g-g in FIG. 9A.

FIG. 9E is a figure showing an example of a cross section g-g in FIG. 9A. The cross section g-g is a cross section passing through the contact region 15. In contrast to the structure of the mesa portion 60 in the cross section f-f, the mesa portion 60 in the cross section g-g has the contact region 15 instead of the emitter region 12. Further, in the contact region 15, the first region 270 is not arranged.

FIG. 9F is a figure showing an example of a cross section h-h in FIG. 9B. The cross section h-h is a cross section passing through the contact region 15. The mesa portion 60 in the cross section h-h has the first region 270, which is a difference in structure from the mesa portion 60 in the cross section g-g. Other structures are similar to those in the cross section g-g.

The first region 270 of the present example is provided in the contact region 15. A part of the first region 270 may be provided in the base region 14, and the entire first region 270 may be provided in the contact region 15. When the cross section h-h has the structure shown in FIG. 9F, the cross section f-f may have the structure shown in FIG. 9D. Further, when the cross section f-f has the structure shown in FIG. 5, at least a part of the first region 270 in the cross section h-h may be provided in the base region 14. In this case, the entire first region 270 may be provided in the base region 14, and a part of the first region 270 may be provided in the contact region 15.

Figure 10:
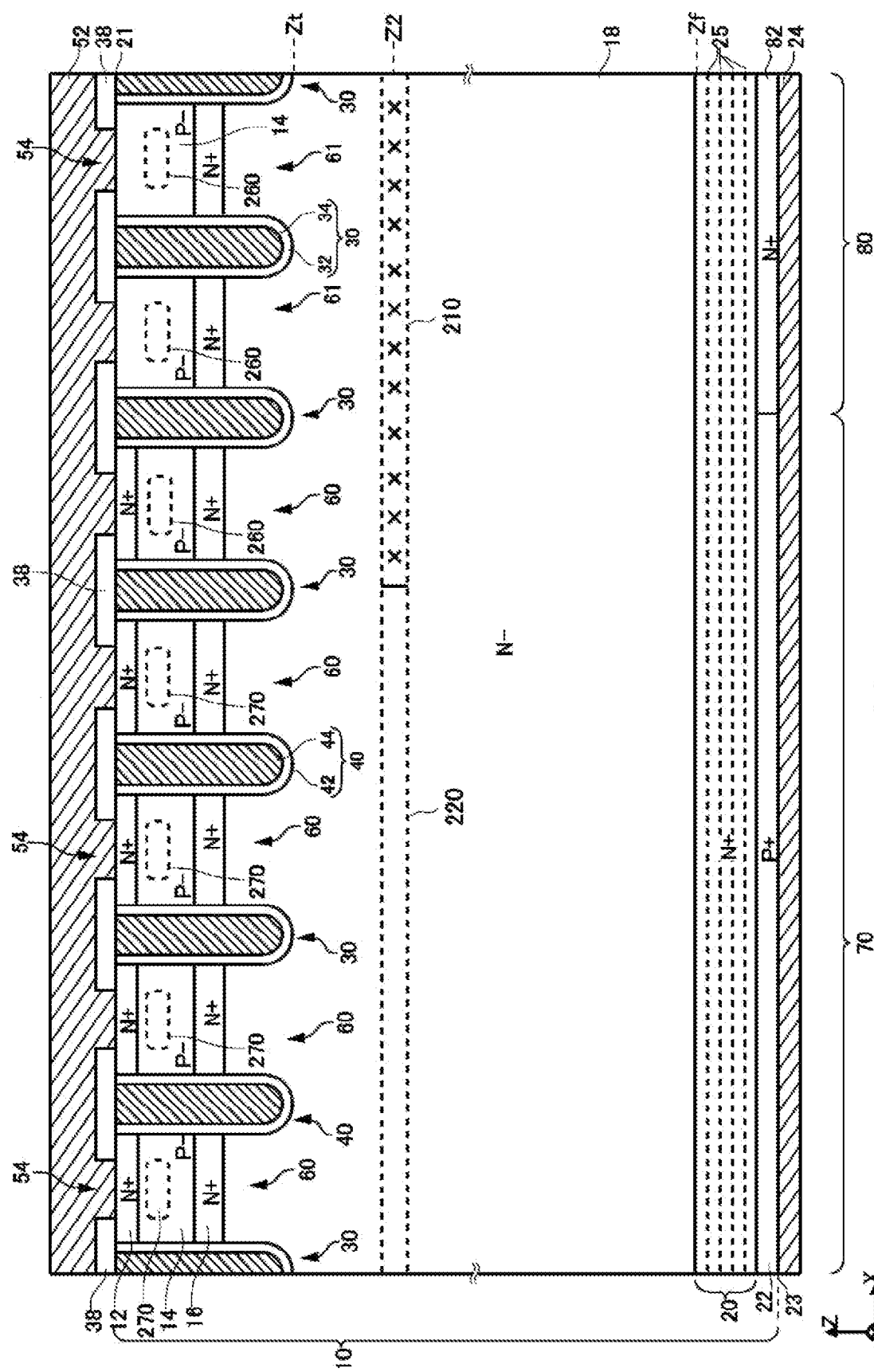
FIG. 10 is a figure showing another example of the cross section e-e in FIG. 2.

FIG. 10 is a figure showing another example of the cross section e-e in FIG. 2. The semiconductor device 100 of the present example has a first lower region 220 and a second lower region 210 that are arranged at a second depth position Z2 on the upper surface 21 side of the semiconductor substrate 10. The second lower region 210 is a region where a concentration of the recombination center at the second depth position Z2 is higher than that of the first lower region 220. In FIG. 10, the recombination center is schematically indicated by cross marks. The recombination center may be a lattice defect which is mainly formed of a vacancy such as the vacancy and a divacancy, may be a dislocation, may be an interstitial atom, and may be transition metal, or the like.

The recombination center can be formed by implanting a charged particle, for example, a hydrogen ion, a helium ion, or the like, into the semiconductor substrate 10 from the lower surface 23. When the ion such as the hydrogen ion or the helium ion is implanted, an acceleration energy of the ion is adjusted for a range of the ion to be the first depth position Z1.

The second lower region 210 may be provided over the entire diode portion 80 on the XY plane. By providing the second lower region 210 in the diode portion 80, it is possible to reduce a carrier lifetime in the diode portion 80, and to reduce a reverse recovery time. This makes it possible to reduce a reverse recovery loss of the diode portion 80.

The second lower region 210 may be provided to extend up to below the mesa portion 60 provided with the second region 260 in the transistor portion 70. In the present example, one or more mesa portions 60 closest to the diode portion 80 are provided with the second region 260.

The first lower region 220 is a region where the concentration of the recombination center is lower than that of the second lower region 210. At the second depth position Z2, the concentration of the recombination center of the second lower region 210 may be twice or more, 5 times or more, or 10 times or more of the concentration of the recombination center of the first lower region 220. The concentration of the recombination center of the first lower region 220 may be 0.1 times or less, 0.01 times or less, or 0.001 times or less of the concentration of the recombination center of the second lower region 210. The first lower region 220 may not substantially include the recombination center. In this case, even when the first lower region 220 includes the lattice defect or the like, a concentration of the lattice defect may have the same degree as the drift region 18 other than the first lower region 220 and the second lower region 210. That is, the first lower region 220 may be a region in which the carrier lifetime is not intentionally reduced. By the transistor portion 70 not being provided with the recombination center, or being provided with the recombination center with a low concentration, it is possible to reduce the reverse recovery time of the diode portion 80, and to suppress an increase in leakage current in the transistor portion 70.

Figure 11:
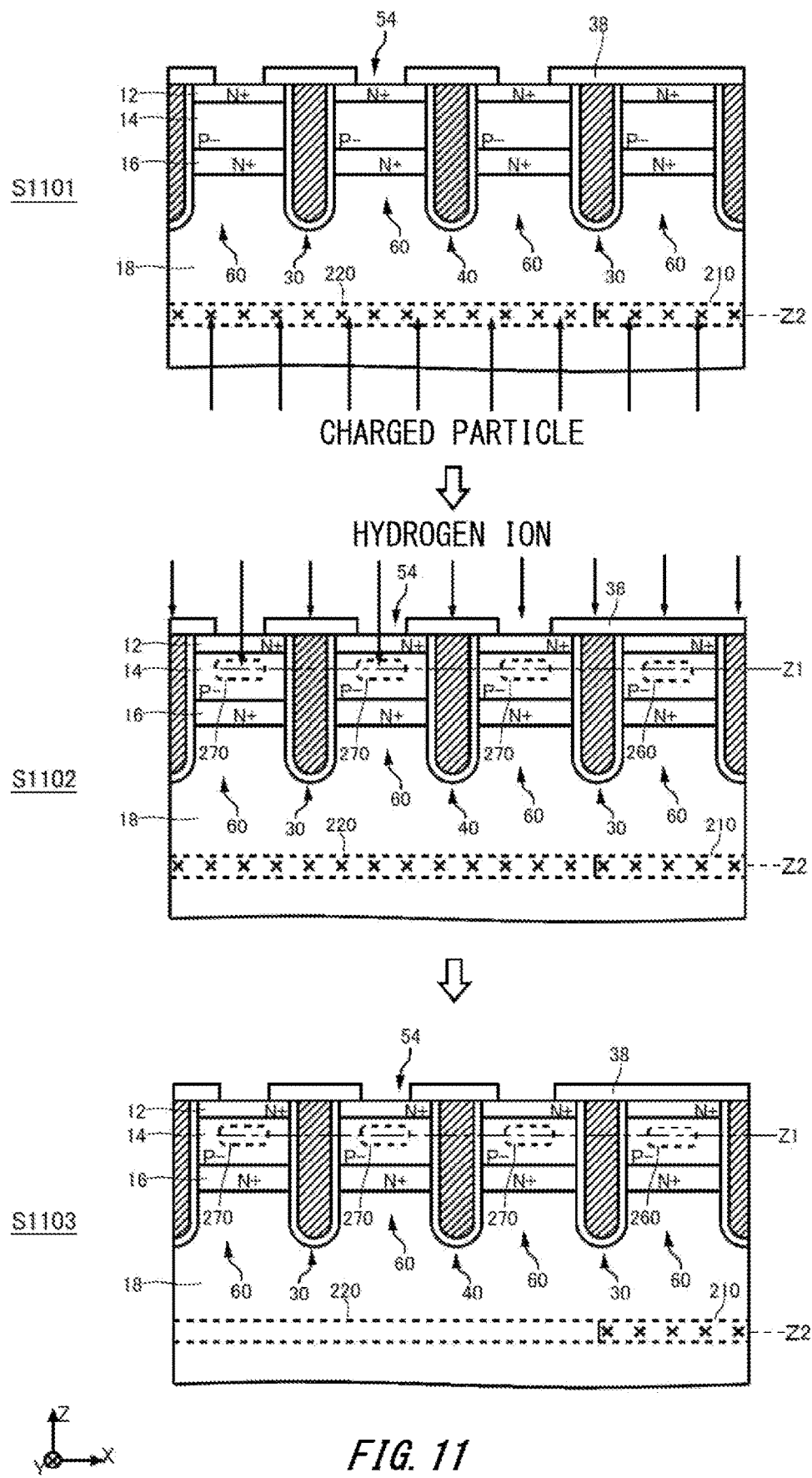
FIG. 11 is a figure showing an example of a manufacturing method for the semiconductor device 100 shown in FIG. 10.

FIG. 11 is a figure showing an example of a manufacturing method for the semiconductor device 100 shown in FIG. 10. First, in first implantation step S1101, the charged particle is implanted at the second depth position Z2 from the lower surface 23. The charged particle of the present example is an ion such as a hydrogen ion or a helium ion. Note that before first implantation step S1101, each trench portion, the emitter region 12, the base region 14, the accumulation region 16, the drift region 18, the buffer region 20, the collector region 22, and the cathode region 82 may be formed in the semiconductor substrate 10. In first implantation step S1101, in both of the first lower region 220 and the second lower region 210, the recombination centers with approximately the same concentration are formed.

Then, in second implantation step S1102, the hydrogen ion is implanted from the upper surface 21 into the base region 14 of each mesa portion so as to form the first region 270. Second implantation step S1102 is similar to the implantation step of the hydrogen ion shown in FIG. 4. Before second implantation step 1102, the interlayer dielectric film 38 may be provided.

Then, in heat treatment step S1103, the semiconductor substrate 10 is heat treated. In heat treatment step S1103, the semiconductor substrate 10 is heat treated on condition that the hydrogen implanted into the first region 270 diffuses up to both of a channel portion which is the boundary between the base region 14 and the gate trench portion 40, and the first lower region 220. In this way, concentrations of the recombination center of the channel portion, and the recombination center of the first lower region 220 are reduced. Accordingly, it is possible to cause the recombination center of the second lower region 210 to selectively remain. This makes it possible to adjust the threshold voltage of the transistor portion 70, and to selectively form the second lower region 210.

In the present example, the first region 270 is formed in a part of a region above the first lower region 220. Note that the hydrogen implanted into the first region 270 diffuses in the XY plane, and thus can terminate the recombination center over the entire first lower region 220. In another example, in the first lower region 220, a concentration of the recombination center in a region below the trench portion may be higher than a concentration of the recombination center in a region below the mesa portion 60.

Note that in a case where the gate dielectric film or the like is provided on the upper surface 21 of the semiconductor substrate 10, when the charged particle is implanted from the upper surface 21, the gate dielectric film may be damaged to change the characteristics such as the threshold voltage. In contrast, by implanting the charged particle at the second depth position Z2 of the semiconductor substrate 10 from the lower surface 23, it is possible to suppress the damage to the upper surface 21 of the semiconductor substrate 10.

However, when the charged particle is implanted from the lower surface 23 to the upper surface 21 side, the acceleration energy of the charged particle becomes high. In such a case, when an attempt is made to selectively implant the charged particle on the XY plane, it becomes difficult to provide a mask such as a photoresist for blocking the charged particle. For example, a film thickness of the mask becomes very great, and thus patterning becomes difficult.

In the present example, in first implantation step S1101, the charged particle is implanted into a region including both of the first lower region 220 and the second lower region 210. In this way, in both of the first lower region 220 and the second lower region 210, the recombination centers with concentrations of the same degree are formed. When the charged particle is helium, chemical concentrations of helium in the first lower region 220 and the second lower region 210 may be the same.

Then, in second implantation step S1102, the hydrogen ion (for example, the proton) is implanted, at a shorter range than that of the charged particle, into a region overlapping the first lower region 220 in the Z axis direction. Since the range of the hydrogen ion is made to be small, damage to the implantation surface is small and selective blocking is easy. By a heat treatment on the semiconductor substrate 10 after the hydrogen ion is implanted, the hydrogen ion diffuses up to the first lower region 220, and combines with the recombination center in the first lower region 220. This makes it possible for the concentration of the recombination center in the first lower region 220 to be lower than the concentration of the recombination center in the second lower region 210. The concentration of the recombination center concentration at the second depth position Z2 of the first lower region 220 may be $1/2$ or less, $1/5$ or less, $1/10$ or less, or $1/100$ or less of the concentration of the recombination center at the second depth position Z2 of the second lower region 210.

Note that a magnitude of the concentration of the recombination center may be determined by comparing carrier lifetimes. A case where the carrier lifetime is short may be said to be a case where the concentration of the recombination center is high. When a definition is made that "the concentration of the recombination center is N times" in the present specification, the definition may be read as "the carrier lifetime is 1/N times".

In the present example, the hydrogen diffuses in the first lower region 220, and the hydrogen hardly diffuses in the second lower region 210. Therefore, a hydrogen chemical concentration at the second depth position Z2 is higher in the first lower region 220 than in the second lower region 210. The hydrogen chemical concentration of the first lower region 220 at the second depth position Z2 may be 10 times or more, 100 times or more, or 1000 times or more of the hydrogen chemical concentration of the second lower region 210 at the second depth position Z2. The hydrogen chemical concentration of the second lower region 210 at the second depth position Z2 may be zero.

Further, the hydrogen chemical concentration at the first depth position Z1 is higher in the first region 270 than in the second region 260. The hydrogen chemical concentration of the first region 270 at the first depth position Z1 may be 10 times or more, 100 times or more, 1000 times or more, or 1010 times or more of the hydrogen chemical concentration of the second region 260 at the first depth position Z1. The hydrogen chemical concentration of the second region 260 at the first depth position Z1 may be zero.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a semiconductor substrate that has an upper surface and a lower surface and that is provided with a drift region of a first conductivity type;
    a plurality of trench portions that are provided to reach the drift region from the upper surface of the semiconductor substrate and arrayed in a first direction;
    a mesa portion that is interposed between adjacent two trench portions among the plurality of trench portions;
    an interlayer dielectric film that is provided on an upper surface of the mesa portion; and
    a contact hole that is provided in the interlayer dielectric film,
    wherein the mesa portion has
        a base region of a second conductivity type that is provided between the drift region and the upper surface, and
        a first region that is provided within the base region and has a concentration peak of a hydrogen chemical concentration at a first depth position in the mesa portion,
    wherein ends of the first region in the first direction are aligned with ends of the contact hole in the first direction, and
    wherein the hydrogen chemical concentration at the first depth position continuously decreases, in the first direction, from the ends of the first region until reaching the adjacent two trench portions.

2. The semiconductor device according to claim 1, wherein the first depth position is above a lower end of the base region.

3. The semiconductor device according to claim 1, comprising:
    a second region that is provided in the mesa portion different from the mesa portion in which the first region is provided and that has a lower hydrogen chemical concentration at the first depth position than a hydrogen chemical concentration at the first depth position in the first region.

4. The semiconductor device according to claim 3, further comprising:
    a transistor portion that has a collector region of the second conductivity type between the drift region and the lower surface of the semiconductor substrate; and
    a diode portion that has a cathode region of the first conductivity type between the drift region and the lower surface of the semiconductor substrate, wherein
    the first region is provided in the mesa portion of the transistor portion, and
    the second region is provided in the mesa portion of the diode portion.

5. The semiconductor device according to claim 4, wherein
    the transistor portion has a region of the first conductivity type and a region of the second conductivity type that are alternately arranged along a longitudinal direction of the plurality of trench portions on an upper surface of the mesa portion, and
    the first region is arranged to overlap the region of the first conductivity type and not to overlap the region of the second conductivity type in a top plan view.

6. The semiconductor device according to claim 3, further comprising:
    a first lower region that is arranged below the first region in the semiconductor substrate; and
    a second lower region that is provided at the same depth position as the first lower region and that is arranged below the second region,
    wherein a concentration of a recombination center in the first lower region is lower than a concentration of a recombination center in the second lower region.

7. The semiconductor device according to claim 1, wherein
    the mesa portion has a high concentration region that is arranged between the drift region and the upper surface of the semiconductor substrate and that has a higher doping concentration than a doping concentration of the base region, and
    the first depth position is arranged at a position shallower than a lower end of the high concentration region.

8. The semiconductor device according to claim 7, wherein the base region has a peak of the doping concentration, at a second depth position which is deeper than the first depth position, at an interface in contact with a side wall of the adjacent two trench portions.

9. The semiconductor device according to claim 7, wherein the high concentration region is an emitter region of the first conductivity type that is provided in contact with the adjacent two trench portions and that has a higher doping concentration than a doping concentration of the drift region.

10. The semiconductor device according to claim 7, wherein the high concentration region is a contact region of the second conductivity type that has a higher doping concentration than the doping concentration of the base region.

11. The semiconductor device according to claim 1, further comprising:
    an emitter electrode that is arranged above the upper surface of the semiconductor substrate,
    wherein in a depth direction, a distance between the first depth position, and the upper surface of the semiconductor substrate in contact with the emitter electrode is 1 μm or less.

12. The semiconductor device according to claim 1, further comprising:
an interlayer dielectric film that covers the upper surface of the semiconductor substrate, wherein
the interlayer dielectric film has a contact hole that exposes the upper surface of the semiconductor substrate, and
the first region is provided at a position overlapping the contact hole in a top plan view.

13. The semiconductor device according to claim 1, wherein a portion of the base region includes hydrogen, the portion being in contact with the adjacent two trench portions.

14. The semiconductor device according to claim 1, wherein the first region has the concentration peak below the contact hole.

15. The semiconductor device according to claim 1, wherein the hydrogen chemical concentration at the first depth position is substantially uniform.

16. A semiconductor device comprising:
a semiconductor substrate that has an upper surface and a lower surface and that is provided with a drift region of a first conductivity type;
a plurality of trench portions that are provided to reach the drift region from the upper surface of the semiconductor substrate and arrayed in a first direction;
a mesa portion that is interposed between adjacent two trench portions among the plurality of trench portions;
an interlayer dielectric film that is provided on an upper surface of the mesa portion; and
a contact hole that is provided in the interlayer dielectric film,
wherein the mesa portion has
a base region of a second conductivity type that is provided between the drift region and the upper surface, and
a first region that is provided within the base region and has a concentration peak of a hydrogen chemical concentration at a first depth position in the mesa portion,
wherein the hydrogen chemical concentration at the first depth position continuously decreases, in the first direction, from ends of the first region until reaching the adjacent two trench portions,
wherein the hydrogen chemical concentration in the first region at the first depth position is substantially uniform in the first direction between positions corresponding to ends of the contact hole in the first direction,
wherein the hydrogen chemical concentration at the first depth position at the positions corresponding to the ends of the contact hole in the first direction decreases to a value, at a side wall of the adjacent two trench portions, between 1/10 or more of the hydrogen chemical concentration at the first depth position at a central portion of the mesa portion and 3/4 or less of the hydrogen chemical concentration at the first depth position at the central portion of the mesa portion, and
wherein a recombination center at the side wall of the adjacent two trench portions is terminated by hydrogen that reaches the adjacent two trench portions.

17. The semiconductor device according to claim 16, wherein the ends of the first region in the first direction are aligned with the ends of the contact hole in the first direction.

18. The semiconductor device according to claim 16, wherein the first depth position is above a lower end of the base region.

19. The semiconductor device according to claim 16, comprising:
a second region that is provided in the mesa portion different from the mesa portion in which the first region is provided and that has a lower hydrogen chemical concentration at the first depth position than a hydrogen chemical concentration at the first depth position in the first region.

20. The semiconductor device according to claim 19, further comprising:
a transistor portion that has a collector region of the second conductivity type between the drift region and the lower surface of the semiconductor substrate; and
a diode portion that has a cathode region of the first conductivity type between the drift region and the lower surface of the semiconductor substrate, wherein
the first region is provided in the mesa portion of the transistor portion, and
the second region is provided in the mesa portion of the diode portion.

21. The semiconductor device according to claim 20, wherein
the transistor portion has a region of the first conductivity type and a region of the second conductivity type that are alternately arranged along a longitudinal direction of the plurality of trench portions on an upper surface of the mesa portion, and
the first region is arranged to overlap the region of the first conductivity type and not to overlap the region of the second conductivity type in a top plan view.

22. The semiconductor device according to claim 19, further comprising:
a first lower region that is arranged below the first region in the semiconductor substrate; and
a second lower region that is provided at the same depth position as the first lower region and that is arranged below the second region,
wherein a concentration of the recombination center in the first lower region is lower than a concentration of the recombination center in the second lower region.

23. The semiconductor device according to claim 22, wherein
a boundary between the plurality of trench portions and the base region function as a channel portion, and
a concentration of the recombination center in the channel portion is lower than the concentration of the recombination center in the second lower region.

24. The semiconductor device according to claim 16, wherein
the mesa portion has a high concentration region that is arranged between the drift region and the upper surface of the semiconductor substrate and that has a higher doping concentration than a doping concentration of the base region, and
the first depth position is arranged at a position shallower than a lower end of the high concentration region.

25. The semiconductor device according to claim 24, wherein the base region has a peak of the doping concentration, at a second depth position which is deeper than the first depth position, at an interface in contact with a side wall of the adjacent two trench portions.

26. The semiconductor device according to claim 24,
wherein the high concentration region is an emitter region of the first conductivity type that is provided in contact with the adjacent two trench portions and that has a higher doping concentration than a doping concentration of the drift region.

27. The semiconductor device according to claim 24,
wherein the high concentration region is a contact region of the second conductivity type that has a higher doping concentration than the doping concentration of the base region.

28. The semiconductor device according to claim 16, further comprising:
an emitter electrode that is arranged above the upper surface of the semiconductor substrate,
wherein in a depth direction, a distance between the first depth position, and the upper surface of the semiconductor substrate in contact with the emitter electrode is 1 μm or less.

29. The semiconductor device according to claim 16, further comprising:
an interlayer dielectric film that covers the upper surface of the semiconductor substrate, wherein
the interlayer dielectric film has a contact hole that exposes the upper surface of the semiconductor substrate, and
the first region is provided at a position overlapping the contact hole in a top plan view.

30. The semiconductor device according to claim 16, wherein a portion of the base region includes hydrogen, the portion being in contact with the adjacent two trench portions.

31. The semiconductor device according to claim 16, wherein the first region has the concentration peak below the contact hole.

* * * * *